United States Patent
Ishizu et al.

(10) Patent No.: US 9,715,906 B2
(45) Date of Patent: Jul. 25, 2017

(54) BOOTSTRAP CIRCUIT AND SEMICONDUCTOR DEVICE HAVING BOOTSTRAP CIRCUIT

(71) Applicant: Semiconductor Energy Laboratory Co., Ltd., Kanagawa-ken (JP)

(72) Inventors: Takahiko Ishizu, Kanagawa (JP); Kiyoshi Kato, Kanagawa (JP); Yutaka Shionoiri, Kanagawa (JP); Tatsuya Onuki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/502,209

(22) Filed: Sep. 30, 2014

(65) Prior Publication Data

US 2015/0091629 A1 Apr. 2, 2015

(30) Foreign Application Priority Data

Oct. 2, 2013 (JP) .................................. 2013-207452

(51) Int. Cl.
| | | |
|---|---|---|
| G11C 5/14 | (2006.01) | |
| H01L 21/8258 | (2006.01) | |
| H01L 27/06 | (2006.01) | |
| H01L 27/092 | (2006.01) | |
| H01L 29/786 | (2006.01) | |
| H01L 27/12 | (2006.01) | |
| H01L 29/78 | (2006.01) | |

(52) U.S. Cl.
CPC .......... G11C 5/145 (2013.01); H01L 21/8258 (2013.01); H01L 27/0688 (2013.01);
(Continued)

(58) Field of Classification Search
CPC ....... G11C 5/145; G11C 19/28; G11C 19/285; H02M 3/073; H02M 3/158; H02M 3/07
(Continued)

(56) References Cited

U.S. PATENT DOCUMENTS 5,012,132 A * 4/1991 Wang ........................ G11C 8/08
307/110
5,434,820 A * 7/1995 Kim ........................ G11C 5/146
327/535
(Continued)

FOREIGN PATENT DOCUMENTS

| EP | 1737044 A | 12/2006 |
|---|---|---|
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters) , Sep. 27, 2004, vol. 85, No. 13, pp. 2541-2543.
(Continued)

*Primary Examiner* — John Poos
(74) *Attorney, Agent, or Firm* — Husch Blackwell LLP

(57) ABSTRACT

A bootstrap circuit of which the capacitance of a bootstrap capacitor is small and which requires a shorter precharge period is provided. The bootstrap circuit includes transistors M41 and M42, capacitors BSC1 and BSC2, an inverter INV41, and keeper circuits 43 and 44. A signal OSG with a high voltage is generated from an input signal OSG_IN. As the signal OSG_IN is made a high level, a node SWG is made a high level by BSC1. After a signal BSE1 is made a high level and the node SWG is made a low level by the keeper circuit 44, a signal BSE2 is made a high level. By the capacitance coupling of BSC2, a voltage of an output terminal 22 increases.

12 Claims, 17 Drawing Sheets

(52) U.S. Cl.
CPC ........ *H01L 27/092* (2013.01); *H01L 27/1225* (2013.01); *H01L 29/7869* (2013.01); *H01L 29/78696* (2013.01); *H01L 29/785* (2013.01)

(58) Field of Classification Search
USPC .................... 327/108, 109, 306, 390, 536
See application file for complete search history.

(56) References Cited

U.S. PATENT DOCUMENTS

| | | | |
|---|---|---|---|
| 5,731,856 | A | 3/1998 | Kim et al. |
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,176,742 | B2 | 2/2007 | Aksin et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 8,482,974 | B2 | 7/2013 | Saito et al. |
| 8,614,910 | B2 | 12/2013 | Shionoiri |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2005/0242837 | A1* | 11/2005 | Shin ............... H03K 19/018571 326/81 |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0187089 | A1* | 8/2008 | Miyayama ............ G11C 19/28 377/79 |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0215787 | A1* | 9/2011 | Shionoiri ............ H02M 3/158 323/311 |
| 2011/0216566 | A1* | 9/2011 | Kamata ............. H01L 29/7869 363/127 |
| 2012/0049901 | A1 | 3/2012 | Takewaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-187950 | 9/2011 |
| WO | WO-2004/114391 | 12/2004 |
| WO | WO 2006/096748 A2 | 9/2006 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

(56) References Cited

OTHER PUBLICATIONS

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.
Takahashi.M et al., "Theoretical Analysis of IGZO Transparent Amorphous Oxide Semiconductor,", IDW '08 : Proceedings of the 15th International Display Workshops, Dec. 3, 2008, p. 1637-1640.
Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.
Prins.M et al., "A Ferroelectric Transparent Thin-Film Transistor,", Appl. Phys. Lett. (Applied Physics Letters) , Jun. 17, 1996, vol. 68, No. 25, pp. 3650-3652.
Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.
Osada.T et al., "15.2: Development of Driver-Integrated Panel using Amorphous In—Ga—Zn-Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs ,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits, 2008, vol. 43, No. 1, pp. 292-299.
Ohara.H et al., "Amorphous In—Ga—Zn-Oxide TFTs with Suppressed Variation for 4.0 inch QVGA AMOLED Display,", AM-FPD '09 Digest of Technical Papers, Jul. 1, 2009, pp. 227-230, The Japen Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.
Sakata.J et al., "Development of 4.0-in. AMOLED Display With Driver Circuit Using Amorphous In—Ga—Zn-Oxide TFTs,", IDW '09 : Proceedings of the 16th International Display Workshops, 2009, pp. 689-692.
Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by PEALD Grown ZnO TFT,", IMID '07 Digest, 2007, pp. 1249-1252.
Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.
Osada.T et al., "Development of Driver-Integrated Panel Using Amorphous In—Ga—Zn-Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn-Oxide TFT,", SID Digest '09 : SID International Symposium Digest of Technical Papers, May 31, 2009, pp. 1110-1112.
Ohara.H et al., "21.3:4.0 in. QVGA AMOLED Display Using In—Ga—Zn-Oxide TFTs With a Novel Passivation Layer,", SID Digest '09 : SID International Symposium Digest of Technical Papers, May 31, 2009, pp. 284-287.
Miyasaka.M, "Suftla Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

(56) References Cited

OTHER PUBLICATIONS

Kikuchi.H et al., "39.1:Invited Paper:Optically Isotropic Nanostructured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and SC2O3—A2O3—BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies In ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B. (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-cryst. Solids (Journal of Non-crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S at al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

* cited by examiner

CAAC-OS nc-OS as-sputtered after heat treatment
at 450 °C

BOOTSTRAP CIRCUIT AND SEMICONDUCTOR DEVICE HAVING BOOTSTRAP CIRCUIT

BACKGROUND OF THE INVENTION

1. Field of the Invention

The present invention relates to an object, a method, or a manufacturing method. In addition, the present invention relates to a process, a machine, manufacture, or a composition of matter. In particular, one embodiment of the present invention relates to a semiconductor device, a display device, a light-emitting device, a memory device, a driving method thereof, or a manufacturing method thereof.

Note that in this specification, a semiconductor device means a circuit including a semiconductor element (e.g., a transistor or a diode) and a device including the circuit. The semiconductor device also means any device that can function by utilizing semiconductor characteristics. For example, an integrated circuit, and a chip including an integrated circuit are semiconductor devices. Moreover, a memory device, a display device, a light-emitting device, a lighting device, an electronic device, and the like include a semiconductor device in some cases.

2. Description of the Related Art

A bootstrap circuit that generates a voltage higher than a power supply voltage using capacitive coupling is known (Patent Document 1, for example).

A transistor whose channel formation region includes an oxide semiconductor (OS) such as an In—Ga—Zn oxide (In—Ga—Zn—O) (hereinafter such a transistor is referred to as an OS transistor) is known. It is known that an OS transistor has extremely low off-state current because an oxide semiconductor has a wider bandgap than silicon. Patent Document 2, for example, discloses a semiconductor device using an OS transistor for a memory cell so that data can be held even after power supply is stopped.

PATENT DOCUMENT

[Patent Document 1] PCT International Publication No. 2006/096748
[Patent Document 2] Japanese Published Patent Application No. 2011-187950

SUMMARY OF THE INVENTION

An object of one embodiment of the present invention is at least one of the following: providing a novel semiconductor device having a booster function; miniaturizing a semiconductor device; reducing power consumption of a semiconductor device; improving processing speed of a semiconductor device; and providing a novel semiconductor device.

Note that the description of a plurality of objects does not mutually preclude the existence. Note that one embodiment of the present invention does not necessarily achieve all the objects listed above. Objects other than those listed above are apparent from the description of the specification, drawings, and claims, and also such objects could be an object of one embodiment of the present invention.

One embodiment of the present invention is a bootstrap circuit including a first input terminal and a second input terminal to which a first signal and a second signal are input, respectively, an output terminal, a first transistor, a first capacitor, and a first circuit. One terminal of the first capacitor is connected to the second input terminal, and the other terminal of the first capacitor is connected to the output terminal. The first transistor connects the first input terminal to the output terminal, and is diode-connected so as to allow a forward current to flow from the first input terminal to the output terminal. The first circuit has a function of maintaining a voltage of the output terminal at a low level when the first signal is input and the first signal is at a high level.

One embodiment of the present invention is a bootstrap circuit including a first input terminal and a second input terminal to which a first signal and a second signal are input, respectively, an output terminal, a first transistor and a second transistor, a first capacitor, and a first inverter. One terminal of the first capacitor is connected to the second input terminal, and the other terminal of the first capacitor is connected to the output terminal. The first transistor connects the first input terminal to the output terminal, and is diode-connected so as to allow a forward current to flow from the first input terminal to the output terminal. The second transistor connects the output terminal to a wiring to which a first voltage is input, and a gate of the second transistor is connected to an output node of the first inverter. An input node of the first inverter is connected to the first input terminal.

One embodiment of the present invention is a bootstrap circuit including a first input terminal, a second input terminal, and a third input terminal to which a first signal, a second signal, and a third signal are input, respectively, an output terminal, a first transistor, a second transistor, a third transistor, a fourth transistor, a first capacitor, a second capacitor, a first inverter, a second inverter, and a third inverter. The third input terminal is connected to an input node of the first inverter. The first transistor connects an output node of the first inverter to a gate of the second transistor, and is diode-connected so as to allow a forward current to flow from the output node of the first inverter to the gate of the second transistor. One terminal of the first capacitor is connected to the first input terminal and the other terminal of the first capacitor is connected to the gate of the second transistor. One terminal of the second capacitor is connected to the second input terminal and the other terminal of the second capacitor is connected to the output terminal. The second transistor connects the first input terminal to the output terminal, and is diode-connected so as to allow a forward current to flow from the first input terminal to the output terminal. The third transistor connects the output terminal to a first wiring, and a gate of the third transistor is connected to an output node of the second inverter. An input node of the second inverter is connected the first input terminal. The fourth transistor connects the gate of the second transistor to a second wiring, and a gate of the fourth transistor is connected to an output node of the third inverter. An input node of the third inverter is connected to the output node of the first inverter. A first voltage is input to the first wiring and the second wiring.

One embodiment of the present invention is a semiconductor device including a fifth transistor of which a channel is formed in an oxide semiconductor layer. A signal output from the output terminal of the bootstrap circuit in the above embodiments is input to a gate of the fifth transistor.

One embodiment of the present invention can provide a novel semiconductor device having a booster function, miniaturize a semiconductor device, reduce power consumption of a semiconductor device, improve processing speed of a semiconductor device, or provide a novel semiconductor device.

Note that the description of these effects does not disturb the existence of other effects. One embodiment of the present invention does not necessarily achieve all the objects listed above. Other effects will be apparent from and can be derived from the description of the specification, the drawings, the claims, and the like.

DETAILED DESCRIPTION OF THE INVENTION

Figure 1:
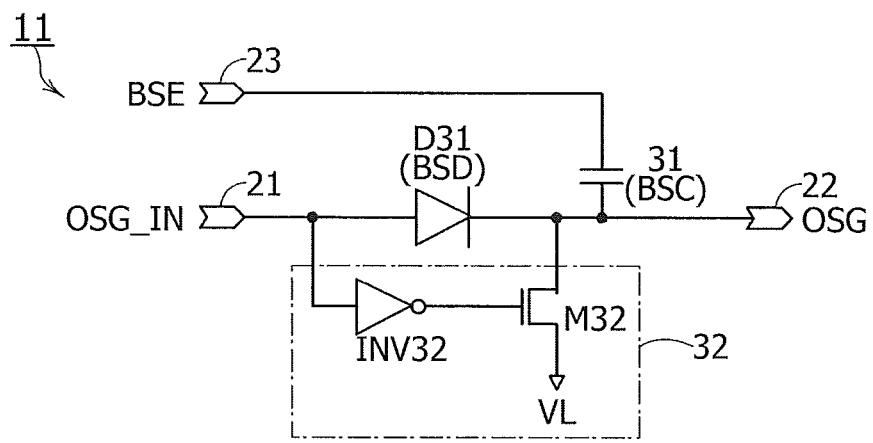
FIG. 1 is a circuit diagram showing an example of a bootstrap circuit configuration.

Hereinafter, embodiments of the present invention will be described in detail with reference to the accompanying drawings. It will be readily appreciated by those skilled in the art that modes and details of the present invention can be changed in various ways without departing from the spirit and scope of the present invention. Therefore, the present invention should not be construed as being limited to the description of the embodiments below.

Although a plurality of embodiments of the present invention will be described below, it is needless to say that any of the embodiments can be combined as appropriate. Furthermore, in the case where some configuration examples are given in one embodiment, any of the configuration examples can be combined as appropriate.

In the drawings used for the description of embodiments of the present invention, the same portions or portions having a similar function are denoted by the same reference numerals, and the repeated description thereof is omitted.

A transistor is an element having three terminals: a gate, a source, and a drain. Depending on the channel type of the transistor or levels of voltages applied to the terminals, one of two terminals (the source and the drain) functions as a source and the other of the two terminals functions as a drain. In general, in an n-channel transistor, a terminal to which low voltage is applied is called a source, and a terminal to which high voltage is applied is called a drain. In contrast, in a p-channel transistor, a terminal to which low voltage is applied is called a drain, and a terminal to which high voltage is applied is called a source.

In the following description, to clarify circuit configuration and circuit operation, one of two terminals of a transistor is fixed as a source and the other of the two terminals is fixed as a drain in some cases. Here, for an n-channel transistor, a terminal (electrode) to which a high-level (H level) signal and high power supply voltage are mainly input is referred to as a drain, and a terminal (electrode) to which a low-level (L level) signal and low power supply voltage are mainly input is referred to as a source. For a p-channel transistor, a terminal (electrode) to which a high-level (H level) signal and high power supply voltage are mainly input is referred to as a source, and a terminal (electrode) to which a low-level (L level) signal and low power supply voltage are mainly input is referred to as a drain. It is needless to say that, depending on a driving method, the magnitude relationship between voltages applied to the terminals of the transistor might be changed, and the source and the drain might be interchanged. Thus, in the semiconductor device of one embodiment of the present invention, the distinction between the source and drain of the transistor is not limited to that described in this specification.

In each of the embodiments of the present invention, a variety of switches can be used as a switch. The switch has a function of determining whether current flows or not by being turned on or off (becoming an on state or an off state). Alternatively, the switch has a function of selecting and changing a current path. For example, the switch has a function of determining whether current can flow through a path 1 or a path 2 and switching the paths. For example, an electrical switch, a mechanical switch, or the like can be used as a switch. That is, any element can be used as a switch as long as it can control current, without limitation to a certain element. For example, a transistor (e.g., a bipolar transistor or a MOS transistor), a diode (e.g., a PN diode, a PIN diode, a Schottky diode, an MIM (metal insulator metal) diode, an MIS (metal insulator semiconductor) diode, or a diode-connected transistor), or a logic circuit in which such elements are combined can be used as a switch. An example of a mechanical switch is a switch formed by a MEMS (micro electro mechanical system) technology, such as a digital micromirror device (DMD). Such a switch includes an electrode which can be moved mechanically, and operates by controlling conduction and non-conduction in accordance with movement of the electrode.

In the case where a transistor is used as a switch, the polarity (conductivity type) of the transistor is not particularly limited to a certain type because it operates just as a switch. However, a transistor of polarity with smaller off-state current is preferably used when off-state current is to be suppressed. Examples of a transistor with smaller off-state current are a transistor provided with an LDD region, a transistor with a multi-gate structure, and the like.

In the case where a transistor is used as a switch, an n-channel transistor is preferably used as the switch when the potential of a source of the transistor which operates as the switch is close to the potential of a low power-supply voltage (e.g., VSS, GND, or 0 V). In contrast, a p-channel transistor is preferably used as the switch when the potential of the source is close to the potential of a high power-supply voltage (e.g., VDD). This is because the absolute value of the gate-source voltage can be increased when the potential of a source of the n-channel transistor is close to the potential of a low power-supply voltage and when the potential of a source of the p-channel transistor is close to the potential of a high power-supply voltage, so that the transistor can more accurately operate as a switch. Alternatively, this is because the transistor does not often perform source follower operation, so that the decrease in output voltage does not often occur.

Note that a CMOS switch may be employed as a switch by using both n-channel and p-channel transistors. With the use of a CMOS switch, the switch can more accurately operate as a switch because current can flow when either the p-channel transistor or the n-channel transistor is turned on. Therefore, voltage can be appropriately output regardless of whether voltage of a signal input to the switch is high or low. Alternatively, since the voltage amplitude value of a signal for turning on or off the switch can be made small, power consumption can be reduced.

Note that when a transistor is used as a switch, the switch includes an input terminal (one of a source and a drain), an output terminal (the other of the source and the drain), and a terminal for controlling conduction (a gate) in some cases. In contrast, when a diode is used as a switch, the switch does not have a terminal for controlling conduction in some cases. Therefore, when a diode is used as a switch, the number of wirings for controlling terminals can be reduced as compared to the case where a transistor is used.

Note that an explicit description "X and Y are connected" indicates the case where X and Y are electrically connected, the case where X and Y are functionally connected, the case where X and Y are directly connected, or the like. Here, X and Y each denote an object (e.g., a device, an element, a circuit, a line, an electrode, a terminal, a conductive film, a layer, or the like). Accordingly, another element may be interposed between elements having a connection relation shown in drawings and texts, without limiting to a predetermined connection relation, for example, the connection relation shown in the drawings and the texts.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, the switch has a function of determining whether current flows or not by being turned on or off (becoming an on state or an off state). Alternatively, the switch has a function of selecting and changing a current path.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a boosting circuit, or a voltage lower control circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generator circuit; a memory circuit; and/or a control circuit) can be connected between X and Y. Note that for example, in the case where a signal output from X is transmitted to Y even when another circuit is interposed between X and Y, X and Y are functionally connected.

Note that when it is explicitly described that "X and Y are connected", the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, the explicit description "X and Y are electrically connected" is the same as the explicit description "X and Y are connected".

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Embodiment 1

In this embodiment, a bootstrap circuit will be described as an example of a semiconductor device.

<<Configuration Example 1 of Bootstrap Circuit>>

FIG. 1 is a circuit diagram showing an example of a bootstrap circuit configuration. A bootstrap circuit 11 includes an input terminal 21, an output terminal 22, an input terminal 23, a capacitor 31, a diode D31, a transistor M32, and an inverter INV32.

The bootstrap circuit 11 has a function of boosting a signal or a voltage input from the input terminal 21 and outputting the signal or the voltage from the output terminal 22. Here, a signal input to the input terminal 21 is called OSG_IN, and a signal output from the output terminal 22 is called OSG. The input terminal 23 is a terminal to which a control signal BSE for controlling a bootstrap operation is input.

In the following description, the inverter INV32 might be abbreviated as INV32. The same applies to signals, voltages, circuits, elements, and wirings.

The capacitor 31 is referred to as a bootstrap capacitor (BSC) in a bootstrap circuit, and one terminal thereof is connected to the input terminal 23 and the other terminal thereof is connected to the output terminal 22. The diode D31 is sometimes referred to as a bootstrap diode (BSD), and a cathode thereof is connected to the input terminal 21 and an anode thereof is connected to the capacitor 31. Here, the capacitor 31 may be referred to as BSC, and the diode D31 may be referred to as BSD.

Note that in the circuit diagram, the device configuration of an element or a circuit expressed by a circuit symbol is not particularly limited. For example, an inverter such as INV32 may be a CMOS transistor; alternatively, it may include only n-channel transistors or only p-channel transistors. A capacitor such as BSC may be an MIM capacitor, for example. Alternatively, the capacitor may be a MOS capacitor, depending on the circuit configuration. Alternatively, parasitic capacitance between wirings or the like, instead of an element intentionally formed, may be utilized.

Figure 2:
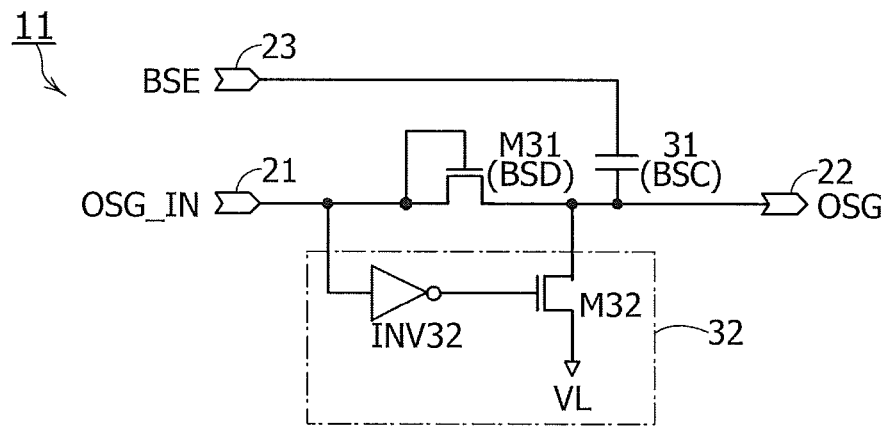
FIG. 2 is a circuit diagram showing an example of a bootstrap circuit configuration.

BSD may be an element or a circuit that has a rectifying property, such as a diode element or a diode-connected transistor. FIG. 2 shows an example in which BSD is a transistor M31 with a gate and a drain thereof being connected (i.e., diode-connected transistor M31). In the example of FIG. 2, the gate and the drain of the transistor M31 are connected to the input terminal 21, and a source of the transistor M31 is connected to BSC. BSD may be a diode-connected p-channel transistor. In that case, the source of the transistor M31 is connected to the input terminal 21, and the gate and the drain of the transistor M31 are connected to BSC.

M32 and INV32 constitute a keeper circuit 32. An input node of INV32 is connected to the cathode of BSD, and an output node thereof is connected to a gate of M32. A source of M32 is connected to a wiring to which a low power-supply voltage VL is supplied, and a drain thereof is connected to the output terminal 22 and one terminal of BSC.

A ground potential (GND) may be used as the low power-supply voltage VL. Note that in general, the value of potential or voltage is a relative value. Therefore, the value of the ground potential is not necessarily 0 V.

The configuration of the keeper circuit 32 is not limited to that shown in FIG. 1. For example, the keeper circuit 32 may include only the transistor M32. In that case, an inversion signal of OSG_IN may be generated outside the bootstrap circuit 11 and input to the gate of the transistor M32.

The keeper circuit 32 has a function of maintaining a voltage level of the output terminal 22 at an L level when the bootstrap circuit 11 is in a standby state. During a period in which the bootstrap circuit 11 is in the standby state, the signal OSG_IN is at an L level. Thus, a voltage of an H level is supplied to the gate of M32 by INV32 and the M32 is turned on, so that the voltage of the output terminal 22 is maintained at VL during this period.

<<Driving Method Example 1>>

Figure 3:
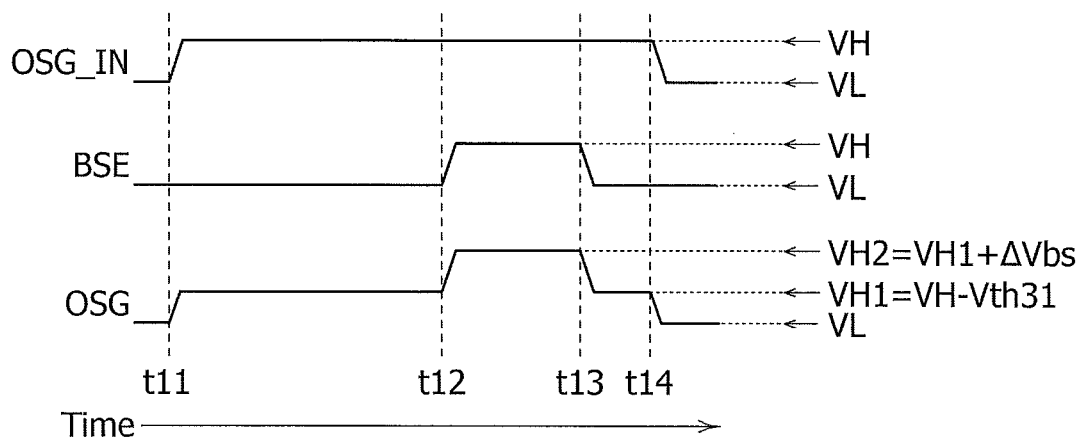
FIG. 3 is a timing chart showing an example of a driving method of a bootstrap circuit.

A driving method of the bootstrap circuit 11 will be described with reference to FIG. 3. FIG. 3 is a timing chart showing an example of the driving method of the bootstrap circuit 11, and shows signal waveforms of when the bootstrap circuit 11 operates. Here, the voltage of input signals OSG_IN and BSE at an L level is VL, and the voltage at an H level is VH (high power-supply voltage).

A time period during which OSG_IN is at an H level (i.e., t11-t14) corresponds to a time period during which the bootstrap circuit 11 is in an operating state.

<t11-t12: Precharge>

During t11-t12, precharge of the output terminal 22 is performed. BSE is at an L level. When OSG_IN rises at t11, current flows between the input terminal 21 and the output terminal 22 owing to the rectifying function of BSD. BSC is charged by this current, so that the voltage of the output terminal 22 is increased. When a certain period of time has passed, the voltage of OSG becomes constant at VH1. VH1 is a voltage lower than VH by the threshold voltage (Vth31) of M31.

<t12-t13: Bootstrap>

When BSE becomes an H level from an L level, the voltage of the output terminal 22 is boosted. The voltage of OSG increases by the voltage ($\Delta$Vbs) corresponding to the capacitance of BSC to the voltage VH2 (=VH1+$\Delta$Vbs). The output signal OSG of the bootstrap circuit 11 during the time period t12-t13 is used as a high power-supply voltage or a signal at an H level. Therefore, the time period (t12-t13) when BSE is at an H level may be determined in accordance with a circuit outputting OSG.

Note that when the capacitance of BSC (capacitor 31) is $C_{31}$ and the capacitance of the output terminal 22 (e.g., parasitic capacitance or coupling capacitance) is $C_{22}$, $\Delta$Vbs is expressed by Formula 1 below.

$$\Delta Vbs = VH \times \frac{C_{31}}{C_{31} + C_{22}} \qquad \text{[Formula 1]}$$

<t13-t14: Discharge>

During t13-t14, only BSE is made an L level. When BSE is made an L level, the voltage of OSG is lowered to the voltage VH1 due to the coupling capacitance of BSC.

<After t14: Standby>

At t14, OSG_IN is also made an L level. By the operation of the keeper circuit 32, the voltage of the output terminal 22 is lowered and maintained at VL.

As shown in FIG. 2, the bootstrap circuit 11 is capable of boosting the voltage of the input signal (OSG_IN) with the small number of elements (four transistors and one capacitor). The capacitance $C_{31}$ of the capacitor 31 (BSC) can be determined by the ratio of the capacitance $C_{31}$ to the capacitance $C_{22}$ of the output terminal 22, and the required output voltage value (VH2). For example, in the case where the bootstrap circuit 11 is used for a circuit generating a drive signal of a memory cell array as described in Embodiment 2, a large number of memory cells are connected to the output terminal 22 and $C_{22}$ becomes very large. As shown by Formula 1, if $C_{22}$ is large, obtaining high $\Delta$Vbs requires $C_{31}$ to be large; consequently, the size of the capacitor 31 increases. Furthermore, in the example of FIG. 2, BSC is charged by the switching operation of the n-channel transistor M31, so that the charging takes time. Consequently, the precharge period needs to be long, and approximately several microseconds are required in some cases, for example.

Hereinafter, another configuration example of a bootstrap circuit that can solve these problems will be described.

<<Configuration Example 2 of Bootstrap Circuit>>

Figure 4:
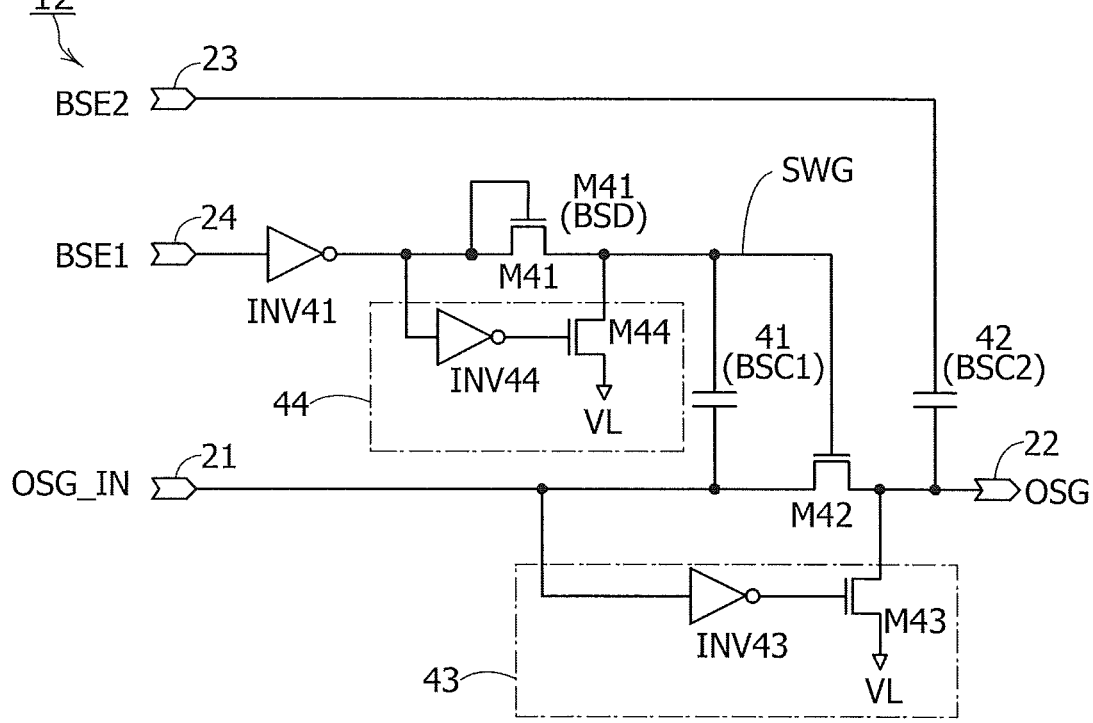
FIG. 4 is a circuit diagram showing an example of a bootstrap circuit configuration.

FIG. 4 is a circuit diagram showing an example of a bootstrap circuit configuration. As shown in FIG. 4, a bootstrap circuit 12 includes input terminals 21, 23, and 24, an output terminal 22, transistors M41 to M44, capacitors 41 and 42, and inverters INV41, INV43, and INV44. The transistors M41 to M44 are n-channel transistors. Each of the inverters INV41, INV43, and INV44 may be a CMOS transistor, for example.

The bootstrap circuit 12 has a function of boosting a signal input from the input terminal 21 and outputting the signal from the output terminal 22. A signal BSE1 and a signal BSE2 are input to the bootstrap circuit 12, as control signals. BSE1 is input to the input terminal 24 and BSE2 is input to the input terminal 23.

Each of the capacitors 41 and 42 is provided as a bootstrap capacitor (BSC). Here, the capacitor 41 may be referred to as BSC1, and the capacitor 42 may be referred to as BSC2.

One terminal of the capacitor 41 is connected to a gate of the transistor M42, and the other terminal of the capacitor 41 is connected to the input terminal 21. Here, the gate of the transistor M42 is referred to as a node SWG. A source of the transistor M42 is connected to the output terminal 22. The capacitor 42 connects the input terminal 23 to the output terminal 22.

An input node of INV41 is connected to the input terminal 24 and an output node of INV41 is connected to a drain of the transistor M41. The transistor M41 constitutes a bootstrap diode (BSD). M41 is diode-connected, and a source thereof is connected to the node SWG. Although FIG. 4 shows an example in which BSD is a diode-connected n-channel transistor, BSD may be an element or a circuit having a rectifying property such as a diode or a diode-connected p-channel transistor.

INV43 and the transistor M43 constitute a keeper circuit 43 with respect to the output terminal 22, and INV44 and the transistor M44 constitute a keeper circuit 44 with respect to the node SWG. The keeper circuits 43 and 44 operate in a manner similar to the keeper circuit 32. The keeper circuit 43 maintains the voltage of the output terminal 22 at an L level during a time period when OSG_IN is at an L level. The keeper circuit 44 maintains the node SWG at an L level during a time period when BSE1 is at an H level (a time period when the output of INV41 is at an L level).

Alternatively, the keeper circuit 43 may include only a switch that is the transistor M43. In that case, an inversion signal of OSG_IN may be input from outside of the bootstrap circuit 12 to a gate of M43. The keeper circuit 44 may include only a switch that is the transistor M44. In that case, BSE1 may be input to the gate of M43.

<<Driving Method Example 2>>

Figure 5:
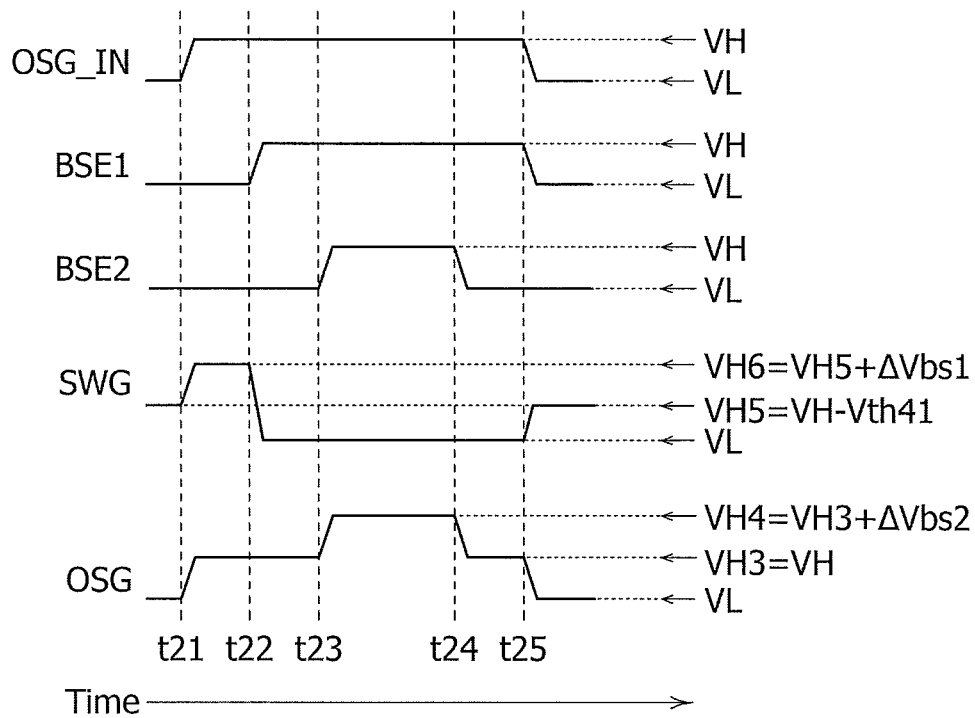
FIG. 5 is a timing chart showing an example of a driving method of a bootstrap circuit.

A driving method of the bootstrap circuit 12 will be described with reference to FIG. 5. FIG. 5 is a timing chart showing an example of the driving method of the bootstrap circuit 12, and shows signal waveforms of when the bootstrap circuit 12 operates. Here, the voltage of input signals OSG_IN, BSE1, and BSE2 at an L level is VL, and the voltage at an H level is VH.

<Before t21: Standby>

The bootstrap circuit 12 is in an operating state during a time period when OSG_IN is at an H level (t21-t25), and is in a standby state before that. In the standby state, the input signals OSG_IN, BSE1, and BSE2 are at an L level. As the output of INV41 becomes an H level, a forward current flows in BSD1 (transistor M41), so that BSC1 (capacitor 41) is charged and the node SWG is charged from VL to VH5. VH5 is a voltage lower than VH by the threshold voltage (Vth41) of the transistor M41. The voltage of OSG is maintained at VL by the operation of the keeper circuit 43.

<t21-t23: Precharge>

During t21-t22, only OSG_IN is made an H level. Owing to capacitive coupling by BSC1, the voltage of the node SWG is increased to be VH6 (=VH5+ΔVbs1).

Note that when the capacitance of the capacitor 41 (BSC1) is $C_{41}$, and the capacitance of the node SWG (coupling capacitance of a source of M41, a drain of M44, and the gate of M42) is $C_{swg}$, ΔVbs1 is expressed by Formula 2 below.

$$\Delta Vbs1 = VH \times \frac{C_{41}}{C_{41} + C_{swg}} \qquad \text{[Formula 2]}$$

Due to an increase in the voltage of the node SWG, the transistor M42 is turned on, whereby the input terminal 21 and the output terminal 22 are connected to each other. Since VH6 is applied to the gate of the transistor M42, the voltage of a source of the transistor M42 is not affected by the threshold voltage of the transistor M42 and becomes VH which is the same as the drain voltage. That is, the voltage of OSG is increased from VL to VH3=VH by the precharge operation.

In this way, in the bootstrap circuit 12, voltage drop due to the threshold voltage of the transistor M42 does not occur, and it is possible to increase OSG to the voltage equal to that of OSG_IN by precharge. Therefore, the capacitance of BSC2 (capacitor 42) can be smaller than that of BSC (capacitor 31) of the bootstrap circuit 11. In addition, since the voltage between the gate and the source of M42 can be high, BSC2 can be charged in a short period of time even when M42 is an n-channel transistor, so that the precharge period can be short.

At t22, BSE1 is made an H level. The voltage of the node SWG is lowered by the keeper circuit 44 and becomes an L level (VL), which turns off the transistor M42. However, the voltage of OSG (output terminal 22) is not changed since it is held in BSC2.

<t23-t24: Bootstrap>

During t23-t24, the voltage of the output terminal 22 is boosted due to the capacitance coupling by BSC2. At t23, when BSE2 becomes an H level from an L level, the voltage of OSG is also increased by ΔVbs2 corresponding to the capacitance value of BSE2 to be the voltage VH4=VH3+ΔVbs2.

The output signal OSG of the bootstrap circuit 12 during this time period is used as a high power-supply voltage or a signal at a high level. Therefore, a time period (t23-t24) when BSE2 is at an H level may be determined in accordance with a circuit outputting OSG.

Note that when the capacitance of BSC2 (capacitor 42) is $C_{42}$ and the capacitance of the output terminal 22 is $C_{22}$, ΔVbs2 is expressed by Formula 3 below.

$$\Delta Vbs2 = VH \times \frac{C_{42}}{C_{42} + C_{22}} \qquad \text{[Formula 3]}$$

<t24-t25: Discharge>

By making BSE2 an L level, the action of the capacitance coupling by BSC2 lowers the voltage of the output terminal 22 to VH3=VH.

<After t25: Standby>

At t25, OSG_IN is made an L level, which makes all the input signals OSG_IN, BSE1, and BSE2 an L level, and the bootstrap circuit 12 becomes a standby state.

The above is an example of the driving method of the bootstrap circuit 12. As described above, in the bootstrap circuit 12, the voltage of the node SWG is precharged by BSC1 (capacitor 41); accordingly, the precharge period can be shortened compared to the bootstrap circuit 11. In addition, by the precharge, the voltage of the output signal OSG can be increased to the voltage VH which is equal to that of the input signal OSG_IN without being affected by the threshold voltage of the transistor.

Furthermore, since the number of elements connected to the node SWG is smaller than the number of elements connected to the output terminal 22, capacitance $C_{swg}$ is extremely smaller than the capacitance $C_{22}$ of the output terminal 22. Therefore, as shown by Formula 2, for obtaining a voltage required for turning on the transistor M42 (i.e., VH6=(VH−Vth41)+ΔVbs1), $C_{41}$ of BSC1 can be sufficiently smaller than the capacitance $C_{42}$ of BSC2. For example, the capacitance $C_{41}$ of BSC1 can be about a fraction of or about one tenth of the capacitance $C_{42}$ of BSC2.

Furthermore, since $C_{42}$ can be smaller than the capacitance $C_{31}$ of BSC as described above, the sum of $C_{41}$ and $C_{42}$ can be smaller than the capacitance $C_{31}$ of BSC of the bootstrap circuit 11. Therefore, although the bootstrap circuit 12 has the larger number of elements and wirings than the bootstrap circuit 11, the layout area for the bootstrap capacitors BSC1 and BSC2 can be reduced, whereby the layout area of the bootstrap circuit 12 can be smaller than that of the bootstrap circuit 11. In addition, energy at charge and discharge of the bootstrap capacitors can be reduced.

The bootstrap circuit of this embodiment can be incorporated, as a circuit generating a high power-supply voltage, into a variety of semiconductor devices. By incorporating the bootstrap circuit and generating a required voltage inside, the number of power-supply voltages input from outside can be reduced, or the power-supply voltage input from outside can be small.

In Embodiment 2 below, a semiconductor device provided with the bootstrap circuit will be described.

Embodiment 2

A semiconductor device having a plurality of circuits arranged in an array, control signal lines corresponding to the arrangement of the circuits, and a driver circuit configured to output a control signal to the control signal lines is known. An active matrix display device having a plurality of pixel circuits (e.g., a liquid crystal display device, or an electroluminescence display device) can be given as one of the typical examples. Also, a memory device in which a plurality of memory cells are arranged in an array (typical examples thereof are a DRAM, an SRAM, and a flash memory) can be given.

In some cases, a control signal with larger amplitude than that of a power-supply voltage of a driver circuit is required to be supplied to a pixel circuit or a memory cell. Incorporating the bootstrap circuit of Embodiment 1, as a circuit for generating such a control signal, into the driver circuit enables the semiconductor device to operate stably without increasing a power-supply voltage input from outside. A control signal that requires a high power-supply voltage is, for example, an erasing signal or a writing signal of a memory device.

The threshold voltage of an OS transistor, for which control of the threshold voltage by addition of a dopant is difficult, is higher than that of a Si transistor in some cases. Therefore, in a semiconductor device in which an OS transistor and a Si transistor are combined, generation of a signal with larger amplitude than that of a control signal of the Si transistor is sometimes required for controlling the OS transistor. The bootstrap circuit of Embodiment 1 is quite suitable for such a semiconductor device. A memory device having a memory cell using an OS transistor will be described below, as an example of a semiconductor device incorporating a bootstrap circuit. Some configuration examples of a memory cell will be described with reference to FIGS. 6A and 6B, FIG. 7, FIG. 8, and FIG. 9. Note that in the drawings, transistors with an indication "Mos" are OS transistors. Transistor with other indications are Si transistors. The OS transistors are n-channel transistors.

<<Configuration Example 1 of Memory Cell>>

Figure 6A:
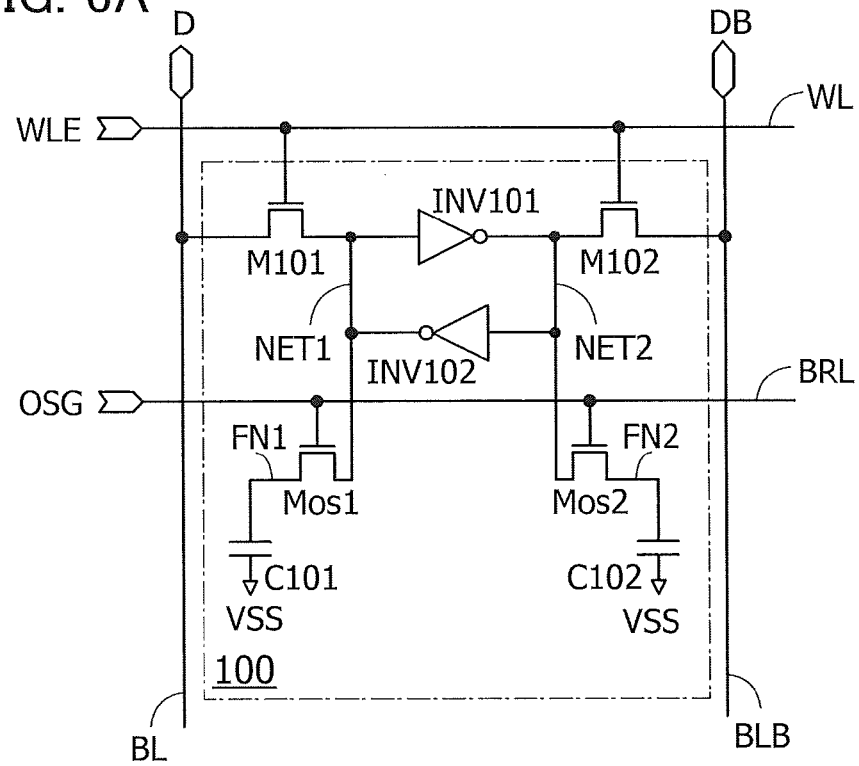
FIGS. 6A and 6B are each a circuit diagram showing an example of a memory cell configuration.
Figure 6B:
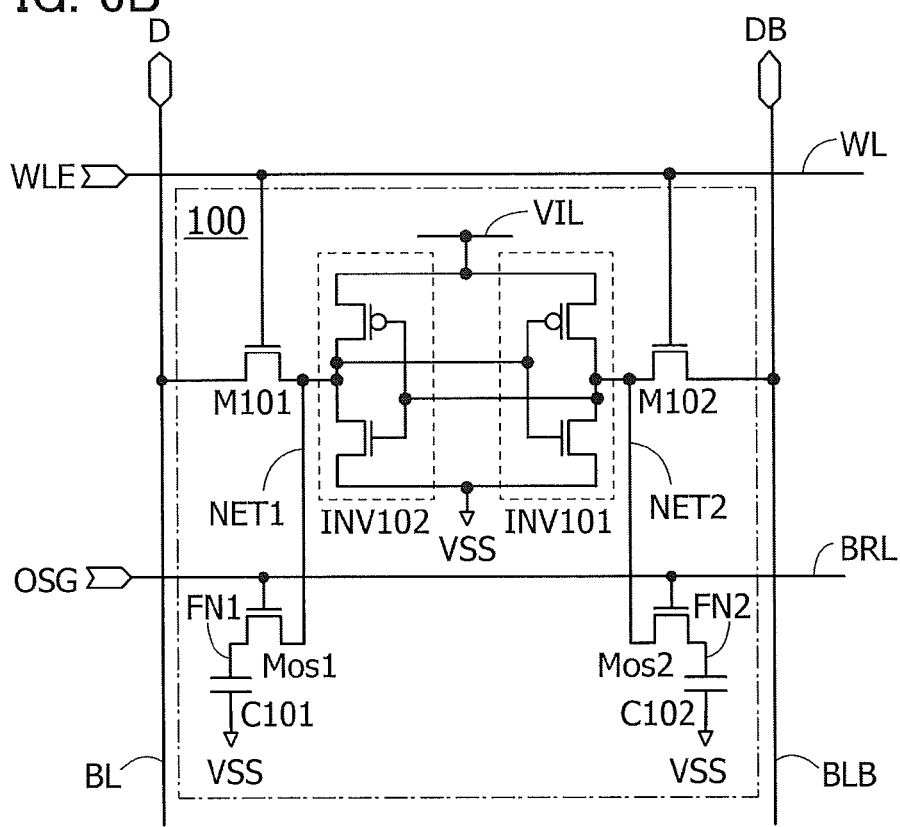

FIGS. 6A and 6B are circuit diagrams showing configuration examples of a memory cell. FIG. 6B shows an example in which logic circuits (inverters) of FIG. 6A are CMOS transistors.

A memory cell 100 includes transistors M101, M102, Mos1, and Mos1, inverters INV101 and INV102, and capacitors C101 and C102. The memory cell 100 is connected to wirings WL, BL, BLB, and BRL. As a low power-supply voltage, VSS is supplied to the memory cell 100. Also, a high power-supply voltage (VDD) is supplied by a wiring VIL to the memory cell 100.

An input node and an output node of INV101 are connected with an output node and an input node of INV102, respectively, whereby an inverter loop circuit is formed. A gate of the M101 and a gate of M102 are connected to WL. M101 functions as a switch connecting BL and the input node of INV101, and M102 functions as a switch connecting BLB and the input node of INV102.

WL functions as a writing/reading word line, and a signal for selecting a memory cell (WLE) is input from a word line driver circuit. BL and BLB function as bit lines supplying data signals D and DB, respectively. The data signal DB is a signal that is obtained by inverting the logic value of the data signal D. The data signals D and DB are supplied from a bit line driver circuit. BL and BLB are also wirings for outputting data read from the memory cell 100 to an output circuit.

The memory cell 100 corresponds to a circuit including flip-flop circuits INV101, INV102, M101, and M102 and a pair of memory circuits (Mos1 and C101) and (Mos2 and C102). The memory circuits (Mos1 and C101) and (Mos2 and C102) are circuits to back up data held in a node NET1 and a node NET2, respectively. Each of these memory circuits turns on the OS transistor to charge or discharge the capacitor so that data is written, and turns off the OS transistor so that data is held in the capacitor as a voltage.

Gates of the transistors Mos1 and Mos2 are connected to the wiring BRL. A signal OSG is input to the wiring BRL. The signal OSG is a signal generated by the bootstrap circuit (FIG. 1 or FIG. 4) of Embodiment 1. The memory cell 100 is driven by the signal OSG, and backup or recovery is performed.

Configurations and operations of memory circuits (Mos1 and C101) and (Mos2 and C102) will be described below.

Nodes FN1 and FN2 are data holding portions where data is held as a voltage. Turning on the transistor Mos1 connects the node NET1 to the node FN1, so that a voltage held in the node NET1 is applied to the node FN1. Turning on the transistor Mos2 connects the node NET2 to the node FN2, so that a voltage held in the node NET2 is applied to the node FN2. In addition, turning off the transistors Mos1 and Mos2 brings the nodes FN1 and FN2 into an electrically floating state, so that the memory circuits are brought into a data holding state.

For example, in the case where the node FN1 is at an H level, electric charge leaks from the C101 and the voltage of the node FN1 might decrease gradually. However, since Mos1 is an OS transistor with an extremely low leakage current (off-state current) flowing between a source and a drain, fluctuation in the voltage of the node FN1 is suppressed. That is, a circuit made up of Mos1 and C101 can operate as a nonvolatile memory circuit. The same can be said for a circuit made up of Mos2 and C102. These circuits can be used as backup memory circuits of the memory cell 100.

An OS transistor has an extremely low off-state current because an oxide semiconductor has a wider band gap (3.0 eV or more) than a semiconductor belonging to Group 14 such as Si or Ge. Extremely low off-state current means that an off-state current per micrometer of channel width is lower than or equal to 100 zA. Because an off-state current is preferably as low as possible, the normalized off-state current is preferably lower than or equal to 10 zA/μm, more preferably lower than or equal to 1 zA/μm, and still more preferably lower than or equal to 10 yA/μm.

By reducing impurities serving as electron donors, such as moisture or hydrogen, and also reducing oxygen vacancies, an i-type (intrinsic) or a substantially i-type oxide semiconductor can be obtained. Here, such an oxide semiconductor is referred to as a highly purified oxide semiconductor. By forming the channel using a highly purified oxide semiconductor layer, the normalized off-state current of the OS transistor can be as low as several yoctoamperes per micrometer to several zeptoamperes per micrometer. The oxide semiconductor and the OS transistor will be described in more detail in Embodiments 3 and 4.

Data is recovered by turning on the transistors Mos1 and Mos2. In a state where power supply to INV101 and INV102 is stopped, the transistors Mos1 and Mos2 are turned on. The node FN1 is connected to the node NET1, whereby data is recovered from the node FN1 to the node NET1. The transistor Mos2 operates in a similar manner, and data is recovered from the node FN2 to the node NET2. Then, power supply to INV101 and INV102 is resumed, and after that, the transistors Mos1 and Mos2 are turned off.

As described above, by forming a memory cell array using the memory cell 100, an SRAM with a backup function can be provided. Furthermore, a capacitor and an OS transistor controlling the charge and discharge of the capacitor can constitute a memory circuit capable of holding data without a refresh operation. As a circuit generating a signal for controlling the on/off of the OS transistor in this memory circuit, the bootstrap circuit of Embodiment 1 can be used.

Another configuration examples of a memory cell having such a memory circuit will be described below.

<<Configuration Example 2 of Memory Cell>>

Figure 7:
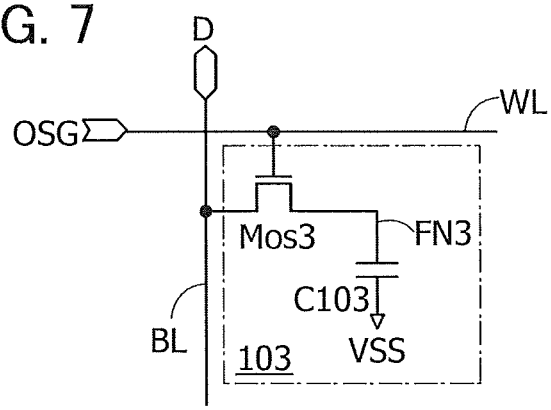
FIG. 7 is a circuit diagram showing an example of a memory cell configuration.

FIG. 7 is a circuit diagram showing a configuration example of a memory cell. A memory cell 103 includes a transistor Mos3 and a capacitor C103. A node FN3 is a data holding portion, and a terminal of the capacitor C103 is connected thereto. The transistor Mos3 functions as a switch connecting the node FN3 to a wiring BL, and a gate of the transistor Mos3 is connected to a wiring WL. As a signal for selecting a memory cell, a signal OSG is input to the wiring WL.

<<Configuration Example 3 of Memory Cell>>

Figure 8:
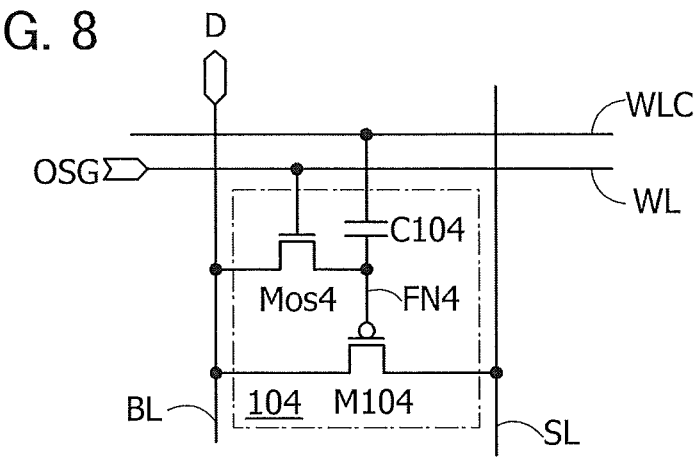
FIG. 8 is a circuit diagram showing an example of a memory cell configuration.

FIG. 8 is a circuit diagram showing a configuration example of a memory cell. A memory cell 104 includes a transistor Mos4, a transistor M104, and a capacitor C104. A node FN4 is a data holding portion. The transistor Mos4 functions as a switch connecting the node FN4 to a wiring BL, and a gate of the transistor Mos4 is connected to a wiring WL. A signal OSG is input to the wiring WL. The capacitor C104 connects a wiring WLC to the node FN4. The wiring WLC is a wiring for supplying a constant voltage to a terminal of C104 at the time of a writing operation and at the time of a reading operation. The transistor M104 is a p-channel transistor, and a gate, a source, and a drain thereof are connected to the node FN4, a wiring SL, and the wiring BL, respectively.

While a constant voltage is applied to the wirings WLC and SL, data is written by turning on the transistor Mos4 and connecting the node FN4 to the wiring BL. For reading data, a constant voltage is applied to the wirings BL, WLC, and SL. The value of a current flowing between the source and the drain of the transistor M104 changes depending on the voltage of the node FN4. The wiring BL is charged or discharged by the current between the source and the drain of the transistor M104, so that the data value held in the memory cell 104 can be read by detecting the voltage of the wiring BL.

The transistor M104 may be an n-channel transistor. In accordance with the conductivity type of the transistor M104, a voltage applied to the wirings BL, SL, and WLC is determined.

<<Configuration Example 4 of Memory Cell>>

Figure 9:
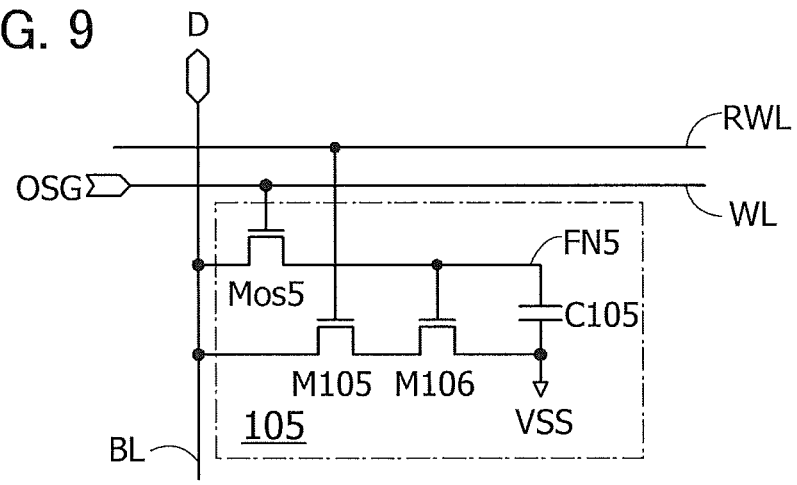
FIG. 9 is a circuit diagram showing an example of a memory cell configuration.

FIG. 9 is a circuit diagram showing a configuration example of a memory cell. A memory cell 105 includes a transistor Mos5, a transistor M105, a transistor M106, and a capacitor C105. A node FN5 is a data holding portion. The transistor Mos5 functions as a switch connecting the node FN5 to a wiring BL, and a gate of the transistor Mos5 is connected to a wiring WL. A signal OSG is input to the wiring WL.

The transistors M105 and M106 connect the wiring BL to one terminal of the capacitor C105. A gate of the transistor M105 is connected to a wiring RWL, and a gate of the transistor M106 is connected to the node FN5. The other terminal of the capacitor C105 is connected to the node FN5.

Data is written by turning on the transistor Mos5 and connecting the node FN5 to the wiring BL. Data is read by turning on the transistor M105. The value of a current flowing between a source and a drain of the transistor M106 changes depending on the voltage of the node FN5. The wiring BL is charged or discharged by the current between the source and the drain of the transistor M106, so that the data value held in the memory cell 105 can be read by detecting the voltage of the wiring BL.

The transistors M105 and M106 may be p-channel transistors. In accordance with the conductivity type of the transistors M105 and M106, a voltage applied to the wiring RWL and a voltage applied to the capacitor C105 may be determined.

With the use of the above memory cells 103 to 105, a nonvolatile random access memory can be provided.

Next, a configuration example of a memory device using an OS transistor will be described. Here, a memory device using the memory cell 100 (FIG. 6A or FIG. 6B) will be described as an example.

<<Configuration Example of Memory Device>>

Figure 10:
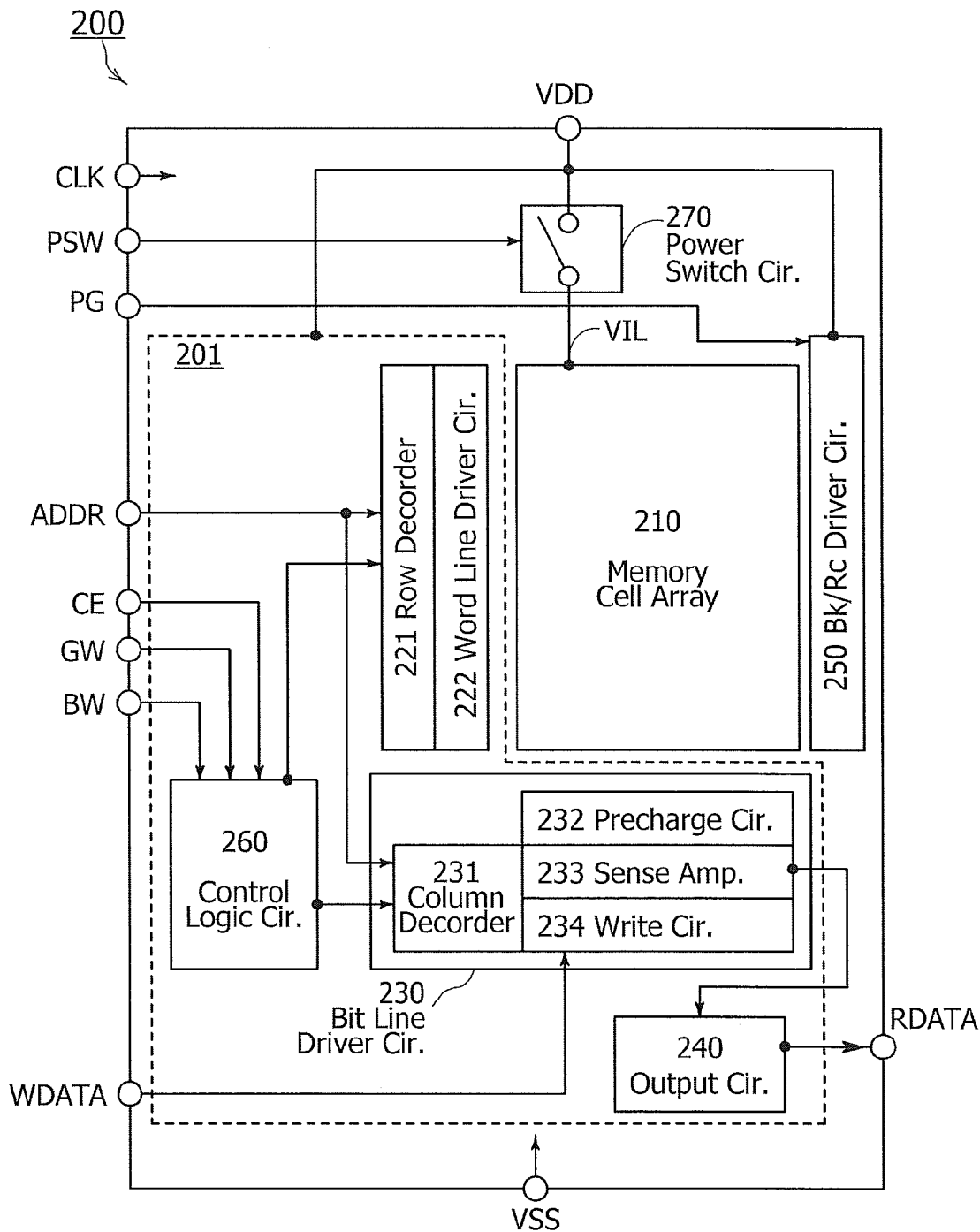
FIG. 10 is a block diagram showing an example of a memory device configuration.

FIG. 10 is a block diagram showing an example of the configuration of a memory device. A memory circuit 200 includes a memory cell array 210, a row decoder 221, a word line driver circuit 222, a bit line driver circuit 230, an output circuit 240, a backup/recovery (Bk/Rc) driver circuit 250, a control logic circuit 260, and a power switch circuit 270.

The bit line driver circuit 230 includes a column decoder 231, a precharge circuit 232, a sense amplifier 233, and a writing circuit 234. The precharge circuit 232 has a function of precharging wirings BL and BLB and a function of making equal the voltages of the wiring BL and the wiring BLB in the same column. The sense amplifier 233 has a function of amplifying data signals D and DB read from the wirings BL and BLB. The amplified data signals are output outside the memory circuit 200 as digital data signals RDATA, through the output circuit 240.

To the memory circuit 200, power supply voltages VSS and VDD are input from the outside.

Furthermore, to the memory circuit 200, a clock signal CLK, control signals CE, GW, and BW, an address signal ADDR, a data signal WDATA are input from the outside. ADDR is input to the row decoder 221 and the column decoder 231, and WDATA is input to the writing circuit 234.

The control logic circuit 260 processes the signals CE, GW, and BW input from the outside, and generates control signals for the row decoder 221 and the column decoder 231. CE is a chip-enable signal, GW is a global write enable signal, and BW is a byte write enable signal. Signals processed by the control logic circuit 260 are not limited to those listed above, and other control signals may be input as necessary.

The memory circuit 200 has a configuration similar to a standard SRAM except the memory cell 100, the Bk/Rc driver circuit 250, and the power switch circuit 270; and can operate in a manner similar to that of the standard SRAM.

Figure 11:
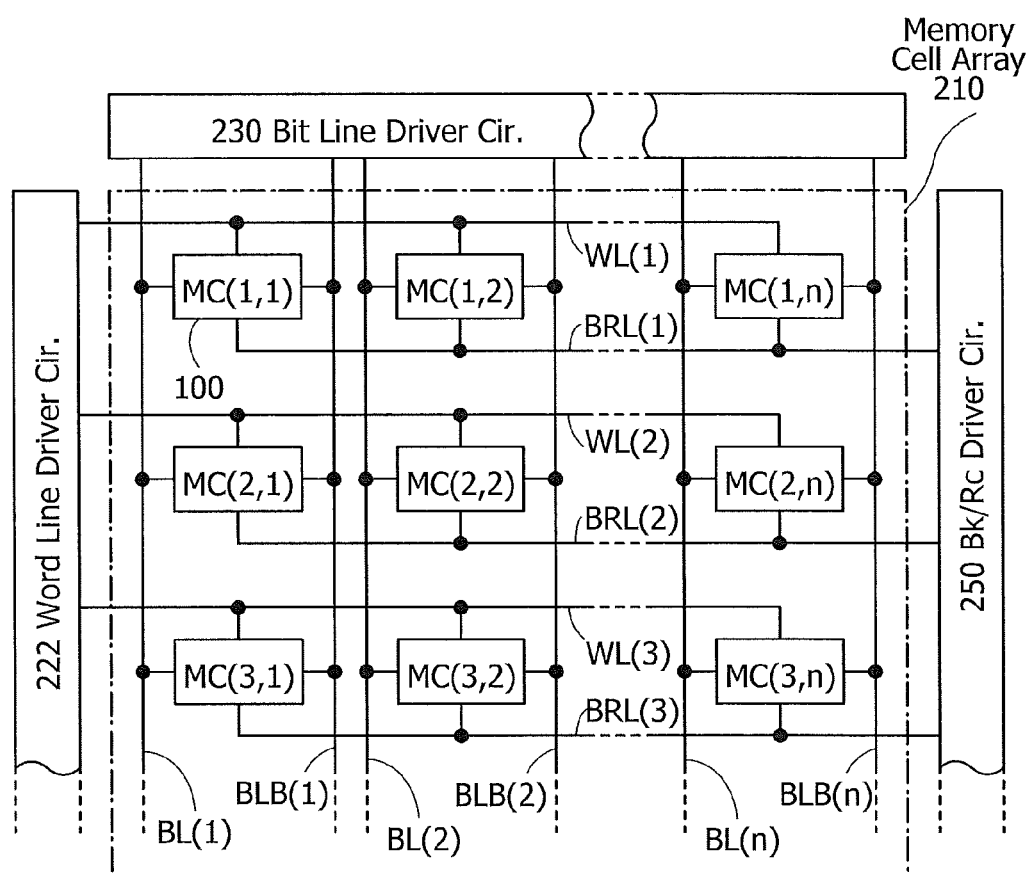
FIG. 11 is a block diagram showing an example of a memory cell array configuration.

FIG. 11 is a block diagram showing an example of the configuration of the memory cell array 210. In the memory cell array 210, a plurality of memory cells (MS) 100 are arranged in arrays. In the memory cell array 210, wirings WL and BRL are provided in each row and wirings BL and BLB are provided in each column, in accordance with the arrangement of the memory cells 100.

The memory cells 100 in the same row are connected to the word line driver circuit 222 through the common wiring WL, and are connected to the Bk/Rc driver circuit 250 through the common wiring BRL. Furthermore, the memory cells 100 in the same column are connected to the bit line driver circuit 230 through the common wirings BL and BLB.

The Bk/Rc driver circuit 250 is a driver circuit for backup and recovery, and has a function of generating a signal OSG output to the wiring BRL. In the Bk/Rc driver circuit 250, at least one bootstrap circuit 12 (FIG. 4) and a signal generating circuit for generating control signals OSG_IN, BSE1, and BSE2 for the bootstrap circuit 12 are provided. The signal generating circuit generates the control signals OSG_IN, BSE1, and BSE2 in accordance with signals PG and CLK, and outputs the control signals to the bootstrap circuit 12.

For example, in the Bk/Rc driver circuit 250, the bootstrap circuit 12 may be provided in each row, or in every plural rows (e.g., every four rows). The output terminal 22 of the bootstrap circuit 12 is connected to the BRL of the corresponding row. Alternatively, the signal OSG may be output from one bootstrap circuit 12 to all the wirings BRL in the memory cell array 210.

The Bk/Rc driver circuit 250 can be provided with the bootstrap circuit 11 (FIG. 1), instead of the bootstrap circuit 12.

The power switch circuit 270 is a circuit controlling the supply of power supply (VDD) to the memory cell array 210, and includes a plurality of switches controlled by a signal PSW from the outside. When these switches are turned on, a wiring VIL is connected to an input terminal of VDD and VDD is supplied to the memory cell array 210. When these switches are turned off, the supply of VDD to the memory cell array 210 is stopped. Here, VDD is supplied to the memory cell array 210 when the signal PSW is at an H level, and the supply of VDD is stopped when the signal PSW is at an L level.

A power switch circuit that similarly controls power supply may be provided in each or some of the circuits in a block 201. With such a structure, fine-grained power gating becomes possible.

<<Driving Method Example of Memory Device>>

In the memory circuit 200, each memory cell 100 is provided with a backup memory circuit; therefore, backup and recovery can be performed in conjunction with the power gating of the memory cell array 210. The backup and recovery operations of the memory circuit 200 will be described below with reference to FIGS. 12 and 13.

<Backup>

Figure 12:
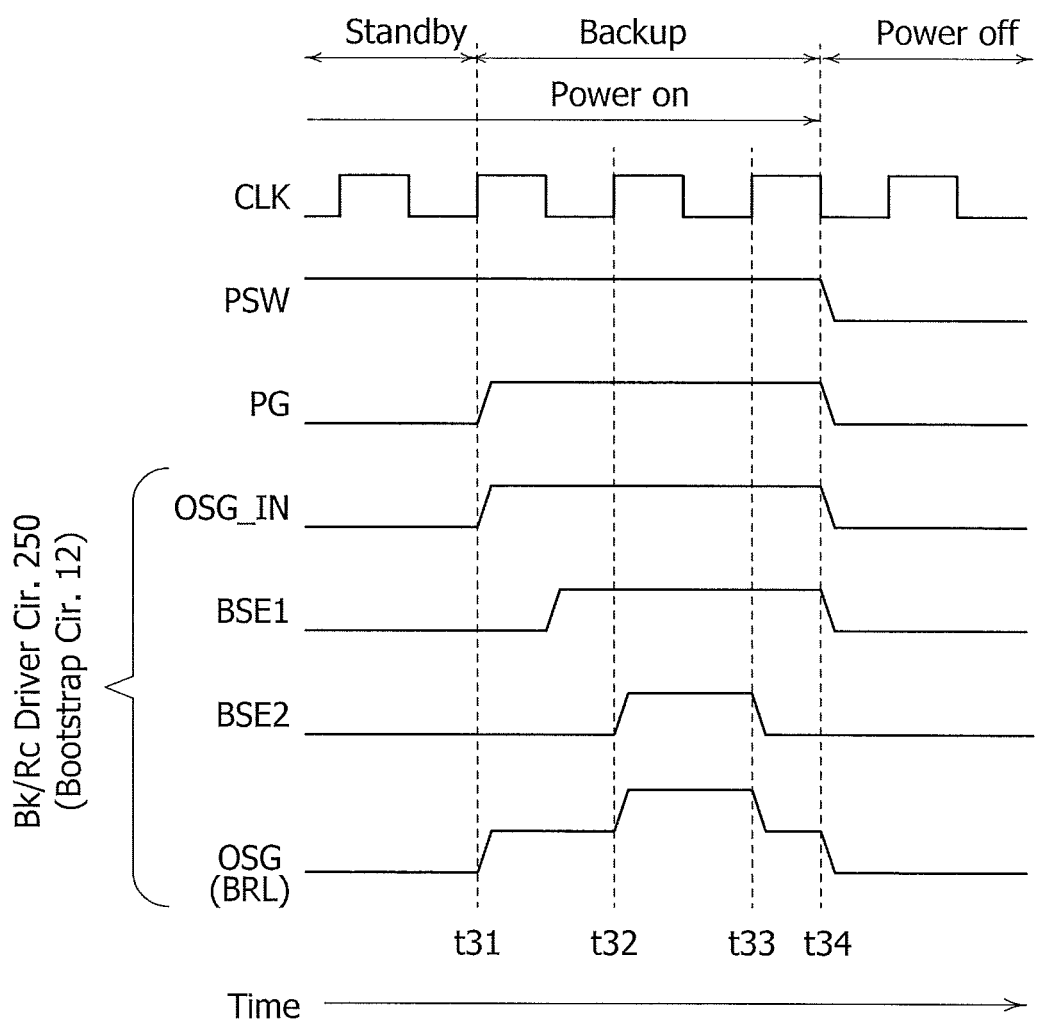
FIG. 12 is a timing chart showing an example of a driving method of a memory device at the time of backup.

FIG. 12 is a timing chart showing an example of the backup operation of the memory circuit 200. The signal OSG is a signal that is generated in the Bk/Rc driver circuit 250 and output to the wiring BRL.

<Before t31: Standby State>

In a standby state, PSW is at an H level, and VDD is supplied to the memory cell array 210. Although CLK is supplied to the memory circuit 200, generation of signals are stopped in the word line driver circuit 222 and the bit line driver circuit 230. Each wiring WL in the memory cell array 210 is at an L level, and a precharge voltage (VDD) is supplied from the precharge circuit 232 to the wirings BL and BLB.

<t31-t33: Backup>

While PSW is at an H level and VDD is supplied to the memory cell array 210, backup is performed. As the signal PG rises, signals OSG_IN, BSE1, and BSE2 for driving the bootstrap circuit 12 are generated in the Bk/Rc driver circuit 250, as shown in FIG. 12, and these signals are output to the bootstrap circuits 12 in all the rows at the same timing. During a time period (t32-t33) when BSE2 is at an H level, the signal OSG has the greatest amplitude and the transistors Mos1 and Mos2 in every memory cell 100 are turned on. As a result, data held in the nodes NET1 and NET2 of the memory cell 100 are written into the nodes FN1 and FN2. When PG becomes an L level at t34, the Bk/Rc driver circuit 250 makes OSG_IN and BSE1 an L level. As a result, the output signal OSG of the Bk/Rc driver circuit 250 becomes an L level and the transistors Mos1 and Mos2 in every memory cell 100 are turned off, whereby data is held in the node FN1 and the node FN2. Thus, the backup operation is completed.

<After t34: Power Off>

The control signal PSW for the power switch circuit 270 becomes an L level at t34, and power supply to the memory cell array 210 is blocked.

<Recovery>

Figure 13:
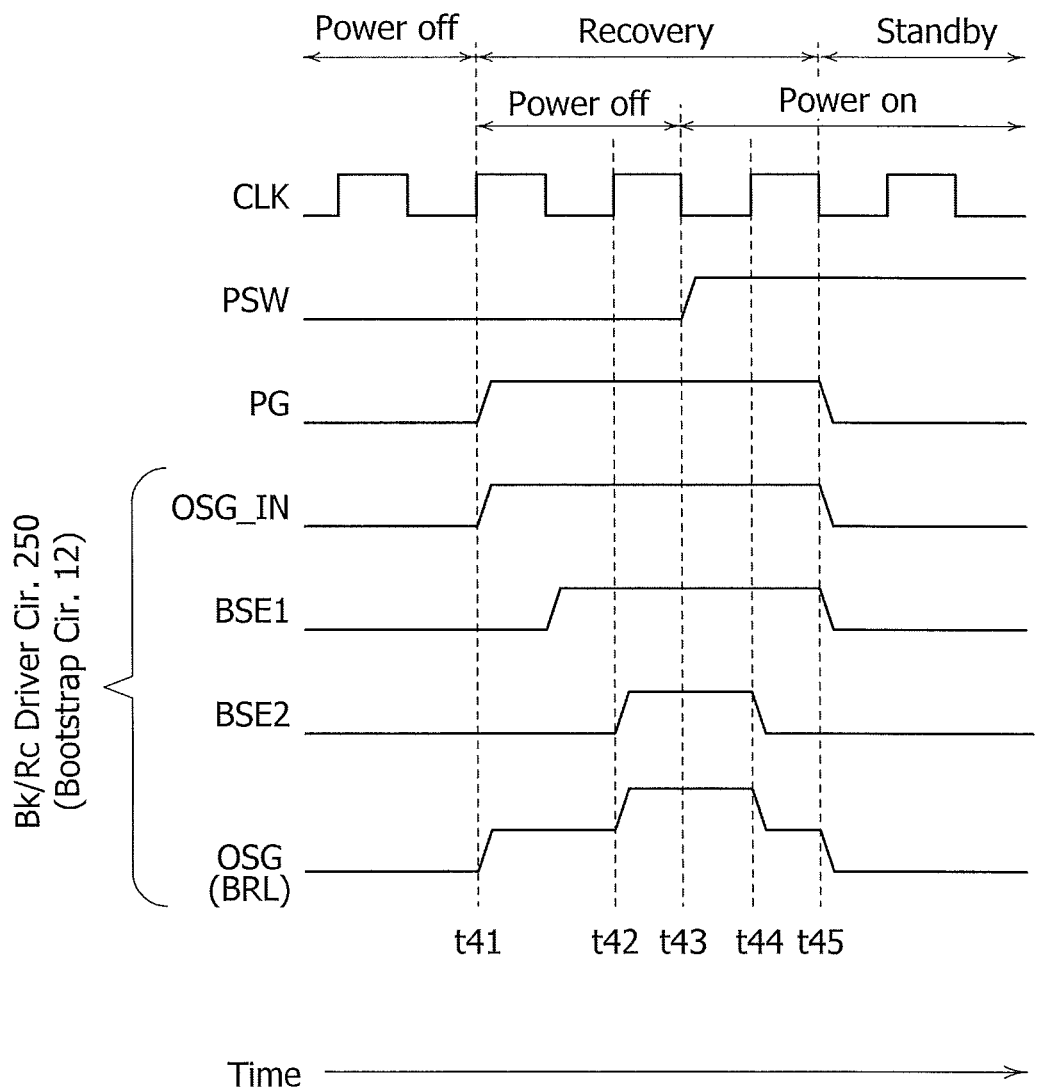
FIG. 13 is a timing chart showing an example of a driving method of a memory device at the time of recovery.

FIG. 13 is a timing chart showing an example of the recovery operation of the memory circuit 200.

<Before t41: Power Off>

Before t41, the control signal PSW for the power switch circuit 270 is at an L level and power supply to the memory cell array 210 is blocked.

<t41-t45: Recovery>

To recover the memory circuit 200 from a power-off state to a standby state, the backed-up data is recovered to flip-flops INV101, INV102, M101, and M102 of the memory cell 100. At t41, the control signal PG of the Bk/Rc driver circuit 250 becomes an H level. During a time period t41-t45, in a way similar to that of backup, the Bk/Rc driver circuit 250 generates signals OSG_IN, BSE1, and BSE2 and outputs the signals to the bootstrap circuit 12 in each row.

During a time period when BSE2 is at an H level (t42-t44), the signal OSG has the greatest amplitude and the transistors Mos1 and Mos2 are turned on in every memory cell 100. As a result, the nodes FN1 and FN2 in the memory cell 100 are connected to the nodes NET1 and NET2. At t43 in this time period, the signal PSW is made an H level to resume the supply of VDD to the memory cell array 210, whereby INV101 and INV102 are operated. Consequently, voltages of the node NET1 and the node NET2 recover to the level before backup.

Then, when PG becomes an L level at t45, the Bk/Re driver circuit 250 makes OSG_IN and BSE1 each an L level. The output signal OSG of the Bk/Rc driver circuit 250 becomes an L level, and the transistors Mos1 and Mos2 are turned off in every memory cell 100, which completes the recovery operation.

<After t45: Standby State>

After the recovery is completed, the memory cell array 210 is recovered to the state before power-off and becomes a standby state.

As shown in FIG. 12 and FIG. 13, the Bk/Rc driver circuit 250 (bootstrap circuit 12) enables the precharge operation of the output terminal 22 of the wiring BRL to be completed in one clock period. Thus, the backup and the recovery can be performed at high speed. In the example of FIG. 12 and FIG. 13, the backup and the recovery take 2.5 clock periods. Here, the frequency of the clock signal CLK is 50 MHz.

Although a memory circuit having the memory cell 100 (FIG. 6A or FIG. 6B) is explained here, the memory cells of the other configuration examples (FIGS. 7 to 9) may constitute a memory circuit in a similar manner. The memory cells shown in FIGS. 7 to 9 do not require the supply of power supply voltage VDD, unlike the memory cell 100, so that the Bk/Rc driver circuit 250 and the power switch circuit 270 need not be provided. The configurations of the word line driver circuit and the bit line driver circuit may be changed appropriately in accordance with the configuration of the memory cell. To supply the signal OSG to the wiring WL in each row, the word line driver circuit may be provided with the bootstrap circuit 11 or the bootstrap circuit 12, at least.

The memory device of this embodiment can be used as a cache memory, main memory, or a storage of a variety of processors (e.g., a CPU, a microcontroller, a programmable device such as an FPGA, and an RFID tag). Furthermore, these processors and the memory device of this embodiment can be incorporated in electronic devices in a variety of fields.

<<Layout>>

The configuration of the memory circuit 200 is different from that of a standard SRAM in that the memory cell 100 is provided with a pair of memory circuits (Mos1 and C101) and (Mos2 and C102), and in that the Bk/Rc driver circuit 250 and the power switch circuit 270 are included. As will be described in Embodiment 3, the memory circuits (Mos1 and C101) and (Mos2 and C102) can be stacked over a memory cell of the standard SRAM in the memory cell 100; accordingly, the area overhead of the memory cell array 210 can be 0%. Thus, the area overhead of the memory circuit 200 results from the Bk/Rc driver circuit 250 and the power switch circuit 270, and can be suppressed to lower than 10% (e.g., approximately 7%).

To increase the capacity of the memory circuit 200, the following measures may be taken: the memory cell array 210 is used as a subarray, a plurality of the subarrays are arranged in an array, and the driver circuits 221, 222, 230, and 250 are provided in each subarray. One control logic circuit 260 and one output circuit 240 are provided with respect to a plurality of the subarrays. Alternatively, part of the control logic circuit 260 and part of the output circuit 240 may be provided in every subarray.

Embodiment 3

In this embodiment, a specific device configuration of a semiconductor device including an OS transistor and a Si transistor will be described.

<<Device Configuration>>

Figure 14A:
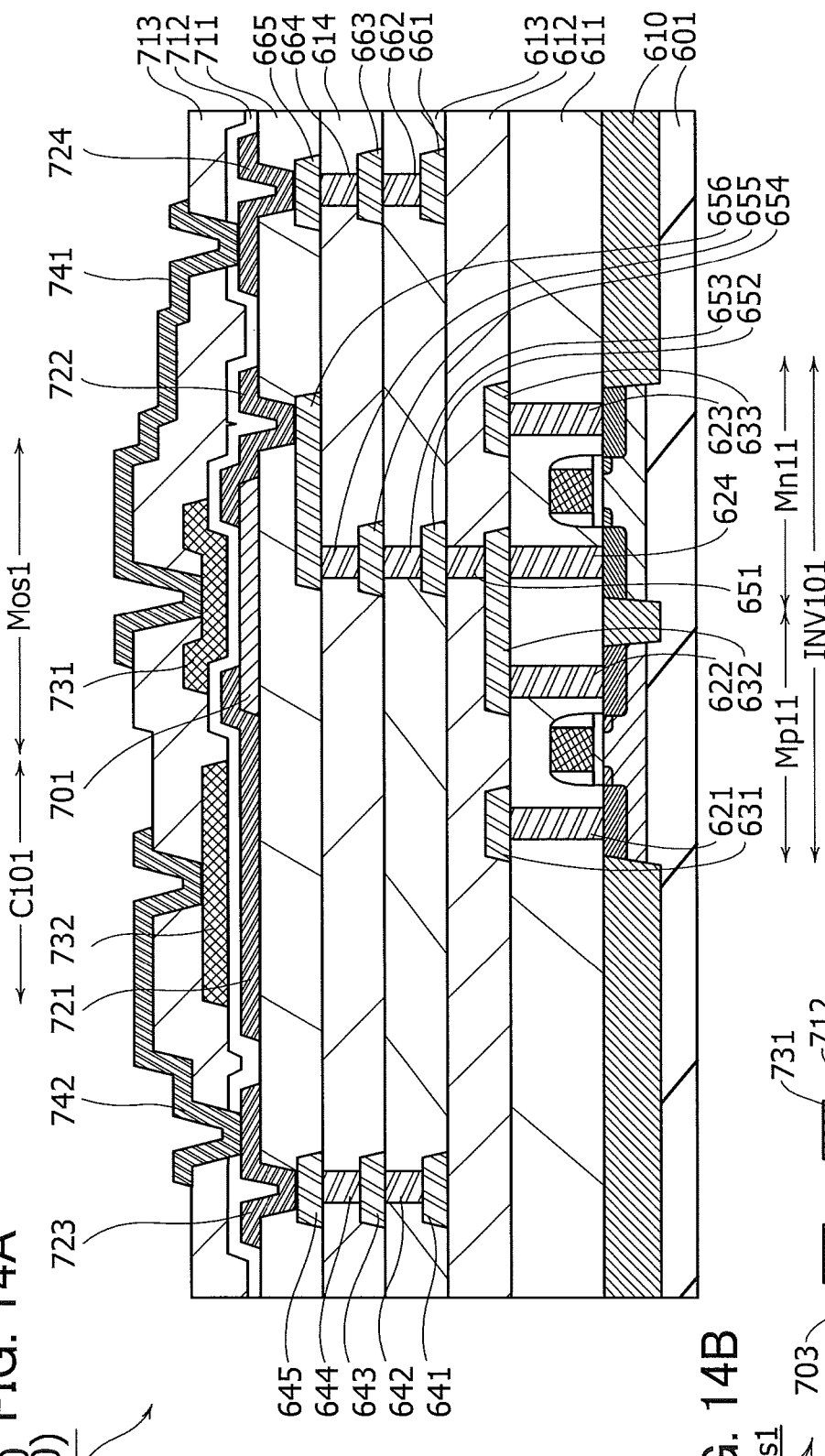
FIGS. 14A and 14B are a cross-sectional view showing an example of a device configuration of a memory device and a cross-sectional view showing an example of a device configuration of a transistor, respectively.

FIG. 14A is a cross-sectional view illustrating an example of the device configuration of a semiconductor device including an OS transistor and a Si transistor. FIG. 14A shows the memory circuit 200 as such a semiconductor device. Note that FIG. 14A is not a cross-sectional view that is taken along a certain section line of the memory circuit 200, but a drawing for explaining the stack structure of the memory circuit 200. FIG. 14A shows, as a typical example, INV101, the transistor Mos1, and the capacitor C101 which constitute the memory cell 100 of the memory circuit 200. Transistors Mp11 and Mn11 are Si transistors which constitute INV101. Mp11 is a p-channel transistor and Mn11 is an n-channel transistor. The transistor Mos1 and the capacitor C101 are stacked over INV101.

The memory circuit 200 is formed using a semiconductor substrate. A bulk single-crystal silicon wafer 601 is used as the semiconductor substrate. Note that a substrate for forming the memory circuit 200 is not limited to the bulk single-crystal silicon wafer but can be any of a variety of semiconductor substrates. For example, an SOI semiconductor substrate having a single-crystal silicon layer may be used.

The transistors Mp11 and Mn11 can be formed using the single-crystal silicon wafer 601 by a known CMOS process. An insulating layer 610 electrically isolates these transistors from each other. An insulating layer 611 is formed to cover the transistors Mp11 and Mn11. Conductors 631 to 633 are formed over the insulating layer 611. Conductors 621 to 624 are formed in openings formed in the insulating layer 611. Mp11 and Mn11 are connected to each other by the conductors 621 to 624 and 631 to 633 as shown in FIG. 14A, whereby INV101 is formed.

One wiring layer or two or more wiring layers are formed over the transistors Mp11 and Mn11 by a wiring process (BEOL: back end of the line). Here, three wiring layers are formed using insulating layers 612 to 614 and conductors 641 to 645, 651 to 656, and 661 to 665.

An insulating layer 711 is formed to cover the wiring layers. The transistor Mos1 the capacitor C101 are formed over the insulating layer 711.

The transistor Mos1 includes an oxide semiconductor (OS) layer 701 and conductors 721, 722, and 731. A channel formation region is formed in the OS layer 701. The conductor 731 constitutes a gate electrode. The conductors 721 and 722 constitute a source electrode and a drain electrode, respectively. The conductor 722 is connected to INV101 by the conductors 651 to 656.

The capacitor C101 is an MIM capacitor. The capacitor C101 includes the conductor 721 and a conductor 732 as electrodes and includes an insulating layer 712 as a dielectric substance (insulating film). The insulating layer 712 also serves as an insulator that constitutes gate insulating layers of Mos1.

An insulating layer 713 is formed to cover Mos1 and C101. Conductors 741 and 742 are formed over the insulating layer 713. The conductors 741 and 742 are connected to Mos1 and C101, respectively, whereby these elements are connected to wirings provided in the wiring layers. For example, as illustrated in FIG. 14A, the conductor 741 is connected to the conductor 661 by the conductors 662 to 665 and a conductor 724. The conductor 742 is connected to the conductor 641 by the conductors 642 to 645 and a conductor 723.

Films constituting the semiconductor device (i.e., an insulating film, a semiconductor film, an oxide semiconductor film, a metal oxide film, a conductive film, and the like)

can be formed by any of a sputtering method, a chemical vapor deposition (CVD) method, a vacuum evaporation method, and a pulsed laser deposition (PLD) method. A coating method or a printing method may also be used. Although the sputtering method and a plasma-enhanced chemical vapor deposition (PECVD) method are typical examples of a film formation method, a thermal CVD method may also be used. As the thermal CVD method, a metal organic chemical vapor deposition (MOCVD) method or an atomic layer deposition (ALD) method may be used, for example.

Deposition by a thermal CVD method may be performed in such a manner that the pressure in a chamber is set to an atmospheric pressure or a reduced pressure, a source gas and an oxidizer are supplied to the chamber at a time and reacted with each other in the vicinity of the substrate or over the substrate, and a film is deposited over the substrate. In this way, a thermal CVD method does not generate plasma and therefore has an advantage that no defect due to plasma damage is developed.

Each of the insulating layers of the memory circuit 200 can be formed using one insulating film or two or more insulating films. Examples of such an insulating film include an aluminum oxide film, a magnesium oxide film, a silicon oxide film, a silicon oxynitride film, a silicon nitride oxide film, a silicon nitride film, a gallium oxide film, a germanium oxide film, an yttrium oxide film, a zirconium oxide film, a lanthanum oxide film, a neodymium oxide film, a hafnium oxide film, and a tantalum oxide film.

Note that in this specification, an oxynitride refers to a substance that contains more oxygen than nitrogen, and a nitride oxide refers to a substance that contains more nitrogen than oxygen.

Each of the conductors of the memory circuit 200 can be formed using one conductive film or two or more conductive films Such conductive films are metal films containing aluminum, chromium, copper, silver, gold, platinum, tantalum, nickel, titanium, molybdenum, tungsten, hafnium, vanadium, niobium, manganese, magnesium, zirconium, beryllium, and the like. Such conductive films can be an alloy film containing any of these metal elements as a component, a compound film containing any of these metal elements as a component, or a polycrystalline silicon film containing an impurity element such as phosphorus, or the like.

<Another Configuration Example of Transistor>

The configurations of the Si transistor and the OS transistor included in the semiconductor device are not limited to those in FIG. 14A. For example, the OS transistor may include a back gate. In that case, an insulating layer and a conductor that constitutes a back gate over the insulating layer may be formed between the conductors 645, 656, and 665 and the conductors 721 to 724.

Figure 14B:
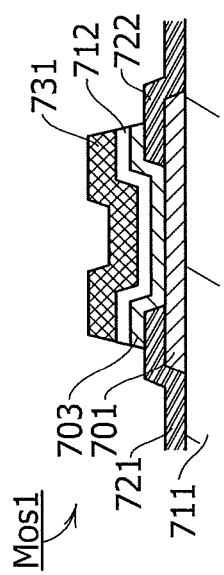

Alternatively, the OS transistor can have a configuration illustrated in FIG. 14B. In FIG. 14B, the transistor Mos1 further includes an OS layer 703. Also in Mos1 in FIG. 14B, a channel formation region is formed in the OS layer 701.

To form Mos1 in FIG. 14B, after the conductors 721 and 722 are formed, one or more oxide semiconductor films used for the OS layer 703, an insulating film used for the insulating layer 712, and a conductive film used for the conductor 731 are stacked. Then, by etching this stacked film with the use of a resist mask for etching the conductive film, the OS layer 703 and the conductor 731 are formed. In that case, in the capacitor C101, a region of the insulating layer 712 which is not covered by the conductor 732 is removed.

For example, in the transistor Mos1 in FIG. 14A, the OS layer 701 is formed using two oxide semiconductor films including different constituent elements. In that case, the lower layer is formed using an In—Zn-based oxide film and the upper layer is formed using an In—Ga—Zn-based oxide film. Alternatively, each of the lower layer and the upper layer can be formed using an In—Ga—Zn-based oxide film.

For example, in the case where the OS layer 701 is formed using two In—Ga—Zn-based oxide films, one of the films can be formed using an oxide film with an atomic ratio of In:Ga:Zn=1:1:1, 5:5:6, or 3:1:2, and the other of the films can be formed using an oxide film with an atomic ratio of In:Ga:Zn=1:3:2, 1:3:4, 1:3:6, 1:6:4, or 1:9:6.

In FIG. 14B, the OS layer 701 may have a two-layer structure and the OS layer 703 may have a single-layer structure, in which case the transistor Mos1 is formed using an oxide semiconductor film with a three-layer structure. Also in that case, all or some of the three layers may be formed using oxide semiconductor films including different constituent elements, or the three layers may be formed using oxide semiconductor films including the same constituent element.

For example, in the case where each of the OS layers 701 and 703 is formed using an In—Ga—Zn-based oxide film, each of the lower layer of the OS layer 701 and the OS layer 703 can be formed using an oxide film with an atomic ratio of In:Ga:Zn=1:3:2, 1:3:4, 1:3:6, 1:6:4, or 1:9:6, and the upper layer of the OS layer 701 can be formed using an oxide film with an atomic ratio of In:Ga:Zn=1:1:1, 5:5:6, or 3:1:2.

Figure 15:
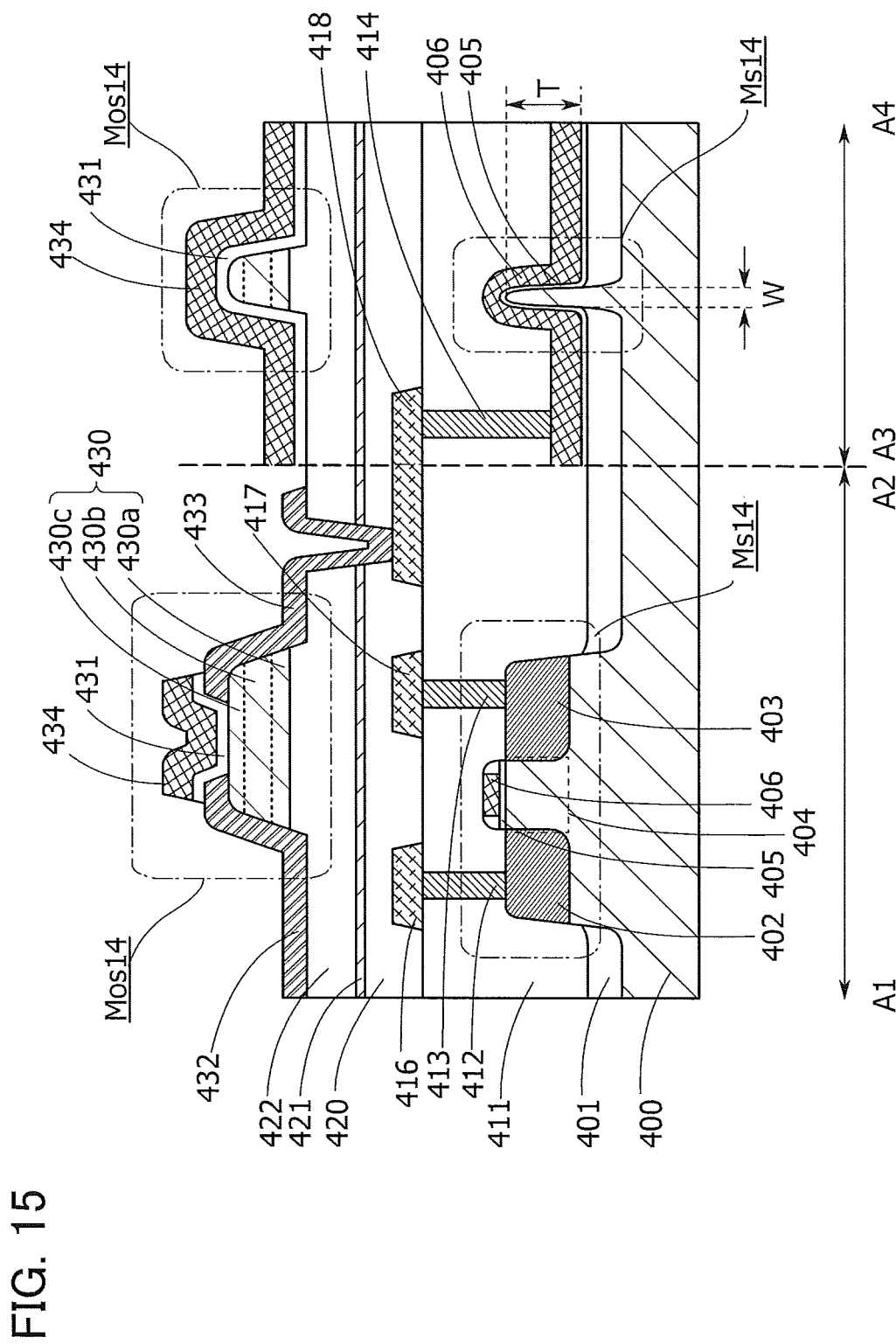
FIG. 15 is a cross-sectional view showing an example of a device configuration of a transistor.

FIG. 15 shows another configuration example of a Si transistor and an OS transistor.

FIG. 15 is a cross-sectional view showing an example of a Si transistor and an OS transistor. In FIG. 15, A1-A2 shows the cross-sectional view of a Si transistor Ms14 and an OS transistor Mos14 in the channel length direction, and A3-A4 shows the cross-sectional view of the Si transistor Ms14 and the OS transistor Mos14 in the channel width direction. Note that the channel length direction of the Si transistor Ms14 and the channel length direction of the OS transistor Mos14 are not necessarily the same in the layout, and FIG. 15 is a drawing for explaining the cross-sectional structures. Furthermore, the case is shown in FIG. 15 where the OS transistor Mos14 including a channel formation region in an oxide semiconductor film is formed over the Si transistor Ms14 including a channel formation region in a single crystal silicon substrate.

Ms14 may include a channel formation region in a semiconductor film or a semiconductor substrate of silicon, germanium, or the like in an amorphous, microcrystalline, polycrystalline, or single crystal state. Alternatively, Ms14 may include a channel formation region in an oxide semiconductor film or an oxide semiconductor substrate. In the case where each of the transistors has the channel formation region in an oxide semiconductor film or an oxide semiconductor substrate, Mos14 need not be stacked over Ms14, and Mos14 and Ms14 may be formed in the same layer.

In the case where Ms14 is formed using a thin silicon film, any of the following can be used: amorphous silicon formed by sputtering or vapor phase growth such as plasma-enhanced CVD; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

A substrate 400 where Ms14 is formed can be, for example, a silicon substrate, a germanium substrate, or a silicon germanium substrate. In FIG. 15, a single crystal silicon substrate is used as the substrate 400.

Ms14 is electrically isolated from other semiconductor elements by an element isolation method. As the element isolation method, a trench isolation method (a shallow trench isolation (STI) method) or the like is used. FIG. 15 illustrates the example where the Si transistor Ms14 is electrically isolated by STI. Specifically, FIG. 15 shows an example in which Ms14 is isolated using an element isolation region 401. The element isolation region 401 is formed in the following manner: a trench which is formed in the substrate 400 by etching or the like is filled with an insulator including silicon oxide or the like, and then, the insulator is partially removed by etching or the like.

In a projection of the substrate 400 that exists in a region other than the trench, an impurity region 402 and an impurity region 403 of Ms14 and a channel formation region 404 sandwiched between the impurity regions 402 and 403 are provided. Furthermore, Ms14 includes an insulating layer 405 covering the channel formation region 404 and a gate electrode 406 that overlaps the channel formation region 404 with the insulating layer 405 provided therebetween.

In Ms14, a side portion and an upper portion of the projection in the channel formation region 404 overlaps with the gate electrode 406 with the insulating layer 405 placed therebetween, so that carriers flow in a wide area including a side portion and an upper portion of the channel formation region 404. Thus, the number of transferred carriers in Ms14 can be increased while an area over the substrate occupied by Ms14 is reduced. As a result, the on-state current and field-effect mobility of ms14 are increased. In particular, if the length of the projection in the channel formation region 404 in a channel width direction (channel width) is denoted by W and the film thickness of the projection in the channel formation region 404 is denoted by T, carriers flow in a wider area when the aspect ratio that corresponds to the ratio of the film thickness T to the channel width W is high. Consequently, the on-state current and field-effect mobility of Ms14 can be further increased.

Note that when Ms14 is formed using a bulk semiconductor substrate, the aspect ratio is desirably 0.5 or more, more desirably 1 or more.

An insulating layer 411 is provided over Ms14, and openings are formed in the insulating layer 411. Conductors 412 and 413 that are electrically connected to the impurity regions 402 and 403, respectively, and a conductor 414 that is electrically connected to the gate electrode 406 are formed in the openings. The conductor 412 is electrically connected to a conductor 416 formed over the insulating layer 411, the conductor 413 is electrically connected to a conductor 417 formed over the insulating layer 411, and the conductor 414 is electrically connected to a conductor 418 formed over the insulating layer 411.

An insulating layer 420 is provided over the conductors 416 to 418. An insulating layer 421 having an effect of blocking diffusion of oxygen, hydrogen, and water is provided over the insulating layer 420. An insulating layer 422 is provided over the insulating layer 421, and Mos14 is provided over the insulating layer 422.

As the insulating layer 421 has higher density and is denser or has a fewer dangling bonds and is more chemically stable, the insulating layer 421 has a higher blocking effect. The insulating layer 421 that has an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. As the insulating layer 421 that has an effect of blocking diffusion of hydrogen and water can be formed using, for example, silicon nitride or silicon nitride oxide.

Mos14 includes an oxide semiconductor layer 430, a conductor 432 and a conductor 433 in contact with the oxide semiconductor layer 430, a gate insulating layer 431 covering the oxide semiconductor layer 430, and a gate electrode 434 overlapping with the oxide semiconductor layer 430 with the gate insulating layer 431 placed therebetween. The conductor 432 and the conductor 433 function as a source electrode or a drain electrode. The conductor 433 is connected to a conductor 418 through an opening provided in the insulating layers 420 to 422.

Note that in FIG. 15, Mos14 includes the gate electrode 434 on at least one side of the oxide semiconductor layer 430; alternatively, Mos14 may also include a gate electrode that overlaps with the oxide semiconductor layer 430 with the insulating layer 422 placed therebetween.

In the case where Mos14 has a pair of gate electrodes, one of the gate electrodes may be supplied with a signal for controlling the on/off state of Mos14, and the other of the gate electrodes may be supplied with a potential from another element. In that case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 15, Mos14 has a single-gate structure where one channel formation region corresponding to one gate electrode 434 is provided. When a plurality of gate electrodes electrically connected to each other are provided in Mos14, for example, Mos14 can have a multi-gate structure where a plurality of channel formation regions are included in one oxide semiconductor layer.

FIG. 15 shows an example in which the oxide semiconductor layer 430 of Mos14 has a three-layer structure made up of oxide semiconductor layers 430a, 430b, and 430c. However, in one embodiment of the present invention, the oxide semiconductor layer 430 of Mos14 may have a single-layer structure of a metal oxide film.

Embodiment 4

In this embodiment, the oxide semiconductor used in the OS transistor will be described.

The channel formation region of the OS transistor is preferably formed using a highly purified oxide semiconductor (purified OS). A purified OS refers to an oxide semiconductor obtained by reduction of impurities such as moisture or hydrogen that serve as electron donors (donors) and reduction of oxygen vacancies. By highly purifying an oxide semiconductor in this manner, the conductivity type of the oxide semiconductor can be intrinsic or substantially intrinsic. The term "substantially intrinsic" means that the carrier density of an oxide semiconductor is lower than $1 \times 10^{17}/cm^3$. The carrier density is preferably lower than $1 \times 10^{15}/cm^3$, more preferably lower than $1 \times 10^{13}/cm^3$.

By forming the channel formation region using a purified OS, the normalized off-state current of the OS transistor can be as low as several yoctoamperes per micrometer to several zeptoamperes per micrometer at room temperature.

In the oxide semiconductor, hydrogen, nitrogen, carbon, silicon, and metal elements that are not main components are impurities. For example, hydrogen and nitrogen form donor levels to increase the carrier density. Silicon forms impurity levels in an oxide semiconductor. The impurity level becomes a trap, which might degrade the electrical characteristics of the OS transistor. It is preferable to reduce the concentration of the impurities in the oxide semiconductor layer and at an interface with another layer.

To make the oxide semiconductor intrinsic or substantially intrinsic, the oxide semiconductor is preferably highly purified to approximately any of the following impurity concentration levels. The following impurity concentrations are obtained by secondary ion mass spectrometry (SIMS) analysis at a certain depth of an oxide semiconductor layer or in a certain region of the oxide semiconductor. The purified OS has any of the following impurity concentration levels.

For example, in the case where the impurity includes silicon, the concentration of silicon is lower than $1 \times 10^{19}$ atoms/cm$^3$, preferably lower than $5 \times 10^{18}$ atoms/cm$^3$, more preferably lower than $1 \times 10^{18}$ atoms/cm$^3$.

For example, in the case where the impurity includes hydrogen, the concentration of hydrogen is lower than or equal to $2 \times 10^{20}$ atoms/cm$^3$, preferably lower than or equal to $5 \times 10^{19}$ atoms/cm$^3$, more preferably lower than or equal to $1 \times 10^{19}$ atoms/cm$^3$, still more preferably lower than or equal to $5 \times 10^{18}$ atoms/cm$^3$.

For example, in the case where the impurity includes nitrogen, the concentration of nitrogen is lower than $5 \times 10^{19}$ atoms/cm$^3$, preferably lower than or equal to $5 \times 10^{18}$ atoms/cm$^3$, more preferably lower than or equal to $1 \times 10^{18}$ atoms/cm$^3$, still more preferably lower than or equal to $5 \times 10^{17}$ atoms/cm$^3$.

In the case where the oxide semiconductor including crystals contains silicon or carbon at high concentration, the crystallinity of the oxide semiconductor might be lowered. In order not to lower the crystallinity of the oxide semiconductor, for example, the concentration of silicon is set lower than $1 \times 10^{19}$ atoms/cm$^3$, preferably lower than $5 \times 10^{18}$ atoms/cm$^3$, further preferably lower than $1 \times 10^{18}$ atoms/cm$^3$. For example, the concentration of carbon is set lower than $1 \times 10^{19}$ atoms/cm$^3$, preferably lower than $5 \times 10^{18}$ atoms/cm$^3$, more preferably lower than $1 \times 10^{18}$ atoms/cm$^3$.

As the oxide semiconductor used for the OS transistor, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that, for example, an In—Ga—Zn-based oxide means an oxide containing In, Ga, and Zn, and there is no limitation on the ratio of In, Ga, and Zn. Further, the In—Ga—Zn-based oxide may contain a metal element other than In, Ga, and Zn. An oxide semiconductor having an appropriate composition may be formed in accordance with needed electrical characteristics (e.g., field-effect mobility and threshold voltage).

For example, In—Ga—Zn-based oxide with an atomic ratio where In:Ga:Zn=1:1:1, In:Ga:Zn=1:3:2, In:Ga:Zn=3:1:2, or In:Ga:Zn=2:1:3, or an oxide whose composition is in the neighborhood of the above compositions can be used. In this specification, the atomic ratio of the oxide semiconductor varies within a range of ±20% as an error.

For example, in the case where an In—Ga—Zn-based oxide is deposited by sputtering, it is preferable to use an In—Ga—Zn-based oxide target with an atomic ratio of In:Ga:Zn=1:1:1, 5:5:6, 4:2:3, 3:1:2, 1:1:2, 2:1:3, 1:3:2, 1:3:4, 1:4:4, 1:6:4, or 3:1:4 as an In—Ga—Zn-based oxide deposition target. When an In—Ga—Zn-based oxide semiconductor film is deposited using such a target, a crystal part is formed in the oxide semiconductor film easily. The filling factor of such a target is preferably higher than or equal to 90%, more preferably higher than or equal to 95%. With a target having a high filling factor, a dense oxide semiconductor film can be deposited.

For example, it is preferable to use an In—Zn-based oxide target with an atomic ratio of In:Zn=50:1 to 1:2 (a molar ratio of $In_2O_3$:ZnO=25:1 to 1:4) as an In—Zn-based oxide deposition target. The atomic ratio of In:Zn is preferably 1.5:1 to 15:1 (the molar ratio of $In_2O_3$:ZnO=3:4 to 15:2). For example, in an In—Zn-based oxide deposition target with an atomic ratio of In:Zn:O=X:Y:Z, the relation Z>1.5X+Y is preferably satisfied. The mobility of an In—Zn-based oxide film can be increased by keeping the ratio of Zn within the above range.

<<Structure of Oxide Semiconductor Film>>

A structure of the oxide semiconductor film will be described below. In the following description, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that an angle formed between two straight lines is greater than or equal to 80° and less than or equal to 100°, and accordingly also includes the case where the angle is greater than or equal to 85° and less than or equal to 95°. Furthermore, the trigonal and rhombohedral crystal systems are included in the hexagonal crystal system.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

<CAAC-OS Film>

First, a CAAC-OS film will be described.

The CAAC-OS film is one of oxide semiconductor films having a plurality of c-axis aligned crystal parts.

With a transmission electron microscope (TEM), a combined analysis image (also referred to as a high-resolution TEM (HR-TEM) image) of a bright-field image and a diffraction pattern of the CAAC-OS film is observed. Consequently, a plurality of crystal parts are observed clearly. However, a boundary between crystal parts, that is, a grain boundary is not clearly observed even in the HR-TEM image. Thus, in the CAAC-OS film, a reduction in electron mobility due to the grain boundary is less likely to occur.

According to the cross-sectional HR-TEM image of the CAAC-OS film observed in a direction substantially parallel to a sample surface, metal atoms are arranged in a layered manner in the crystal parts. Each metal atom layer has a shape reflecting a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

According to the plan-view HR-TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

Figure 16A:
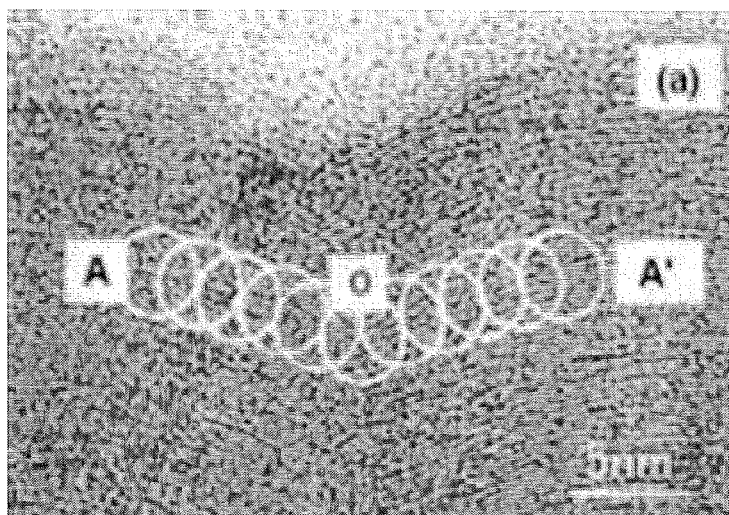
FIGS. 16A and 16B are each a high-resolution cross-sectional TEM image of an oxide semiconductor.
Figure 16B:
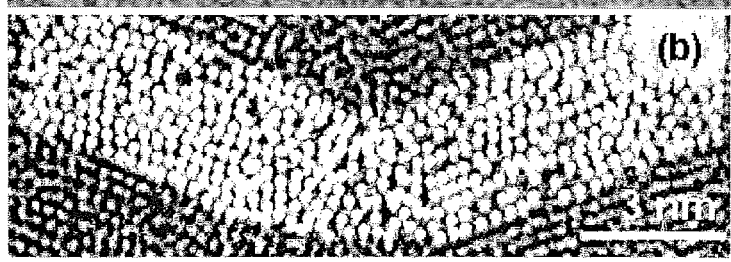

FIG. 16A is a cross-sectional HR-TEM image of a CAAC-OS film FIG. 16B is a cross-sectional HR-TEM image obtained by enlarging the image of FIG. 16A. In FIG. 16B, atomic arrangement is highlighted for easy understanding.

Figure 16C:
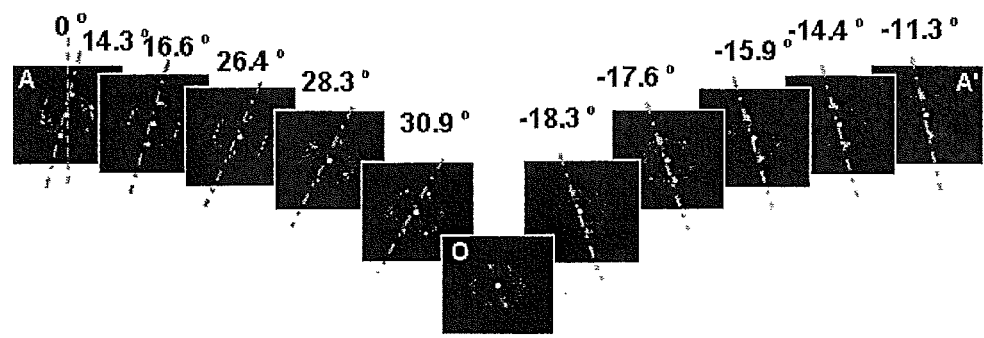
FIG. 16C is a local Fourier transform image of the high-resolution TEM image of FIG. 16A.

FIG. 16C is local Fourier transform images of regions each surrounded by a circle (the diameter is approximately 4 nm) between A and O and between O and A' in FIG. 16A. C-axis alignment can be observed in each region in FIG. 16C. The c-axis direction between A and O is different from that between O and A', which indicates that a grain in the region between A and O is different from that between O and A'. In addition, between A and O, the angle of the c-axis gradually and continuously changes from 14.3°, 16.6° to 30.9°. Similarly, between O and A', the angle of the c-axis gradually and continuously changes from −18.3°, −17.6°, to −11.3°.

Note that in an electron diffraction pattern of the CAAC-OS film, spots (bright spots) having alignment are shown. For example, when electron diffraction with an electron beam having a diameter of 1 nm or more and 30 nm or less (such electron diffraction is also referred to as nanobeam electron diffraction) is performed on the top surface of the CAAC-OS film, spots are observed (see FIG. 17A).

From the cross-sectional HR-TEM image and the plan-view HR-TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm$^2$ or more, 5 µm$^2$ or more, or 1000 µm$^2$ or more is observed in some cases in the plan-view HR-TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

In contrast, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. In contrast, for a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional HR-TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Furthermore, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Furthermore, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has a low density of defect states, and thus has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

<Microcrystalline Oxide Semiconductor Film>

Next, a microcrystalline oxide semiconductor film will be described.

In the HR-TEM image of the microcrystalline oxide semiconductor film, there are a region where a crystal part is clearly observed and a region where a crystal part is not observed. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as a nanocrystalline oxide semiconductor (nc-OS) film. In a HR-TEM image, a grain boundary cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than that of a crystal part, a peak which shows a crystal plane does not appear. Furthermore, a diffraction pattern like a halo pattern appears in a selected-area electron diffraction pattern of the nc-OS film which is obtained by using an electron beam having a probe diameter (e.g., larger than or equal to 50 nm) larger than the diameter of a crystal part. Meanwhile, spots are shown in a nanobeam electron diffraction pattern of the nc-OS film which is obtained by using an electron beam having a probe diameter close to or smaller than the diameter of a crystal part. Furthermore, in a nanobeam electron diffraction pattern of the nc-OS film, regions with high luminance in a circular (ring) pattern are shown in some cases. Furthermore, in a nanobeam electron diffraction pattern of the nc-OS film, a plurality of circumferentially distributed spots may be observed (see FIG. 17B).

The nc-OS film is an oxide semiconductor film that has high regularity as compared to an amorphous oxide semiconductor film Therefore, the nc-OS film has a lower density of defect states than an amorphous oxide semiconductor film. Note that there is no regularity of crystal orientation between different crystal parts in the nc-OS film. Thus, the nc-OS film has a higher density of defect states than the CAAC-OS film.

Note that an oxide semiconductor film may be a stacked film including two or more kinds of an amorphous oxide semiconductor film, a microcrystalline oxide semiconductor film, and a CAAC-OS film, for example.

In the case where the oxide semiconductor film has a plurality of structures, the structures can be analyzed using nanobeam electron diffraction in some cases.

Figure 18A:
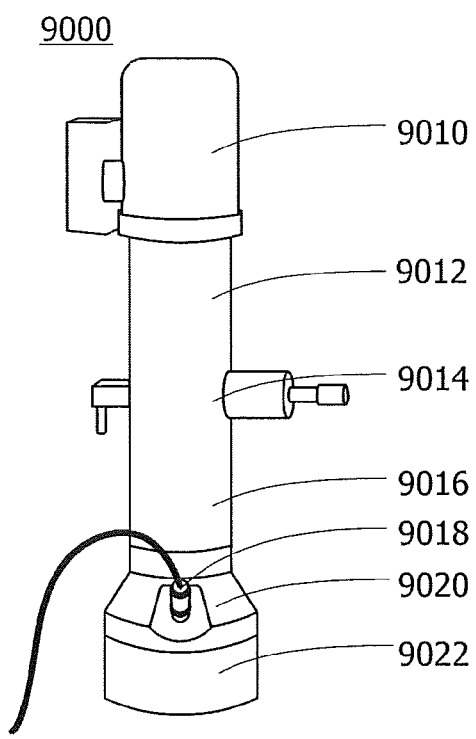
FIGS. 18A and 18B each illustrate a configuration example of a transmission electron diffraction measurement apparatus.
Figure 18B:
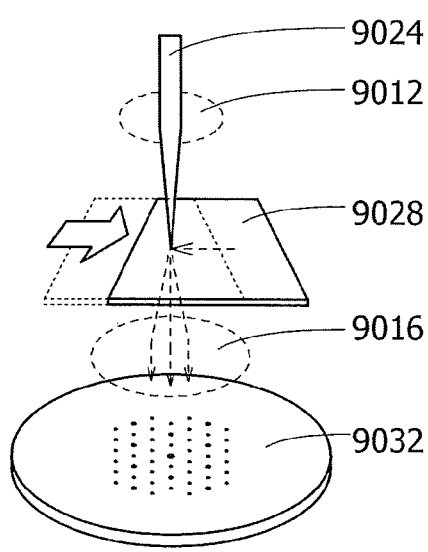

FIGS. 18A and 18B illustrate an example of a transmission electron diffraction measurement apparatus. FIG. 18A shows the appearance of the transmission electron diffraction measurement apparatus, and FIG. 18B shows the inner structure thereof.

A transmission electron diffraction measurement apparatus 9000 includes an electron gun chamber 9010, an optical system 9012, a sample chamber 9014, an optical system 9016, an observation chamber 9020, and a film chamber 9022. A camera 9018 and a fluorescent plate 9032 are provided in the observation chamber 9020. The camera 9018 is installed so as to face the fluorescent plate 9032. Note that the film chamber 9022 is not necessarily provided.

In the transmission electron diffraction measurement apparatus 9000, a substance 9028 placed in the sample chamber 9014 is irradiated with electrons ejected from an electron gun provided in the electron gun chamber 9010 through the optical system 9012. Electrons passing through the substance 9028 enter the fluorescent plate 9032 through the optical system 9016. On the fluorescent plate 9032, a pattern corresponding to the intensity of entered electron appears, which allows measurement of a transmission electron diffraction pattern.

The camera 9018 is installed so as to face the fluorescent plate 9032 and can take a picture of a pattern appearing in the fluorescent plate 9032. An angle formed by a straight line which passes through the center of a lens of the camera 9018 and the center of the fluorescent plate 9032 and an upper surface of the fluorescent plate 9032 is, for example, 15° or more and 80° or less, 30° or more and 75° or less, or 45° or more and 70° or less. As the angle is reduced, distortion of the transmission electron diffraction pattern taken by the camera 9018 becomes larger. Note that if the angle is obtained in advance, the distortion of an obtained transmission electron diffraction pattern can be corrected.

Note that the film chamber 9022 may be provided with the camera 9018. For example, the camera 9018 may be set in the film chamber 9022 so as to be opposite to the incident direction of electrons 9024. In that case, a transmission electron diffraction pattern with less distortion can be taken from the rear surface of the fluorescent plate 9032.

A holder for fixing the substance 9028 that is a sample is provided in the sample chamber 9014. The holder transmits electrons passing through the substance 9028. The holder may have, for example, a function of moving the substance 9028 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 μm. The range is preferably determined to be an optimal range for the structure of the substance 9028.

Next, a method of measuring a transmission electron diffraction pattern of a substance with the use of the transmission electron diffraction measurement apparatus 9000 will be described.

Figure 17A:
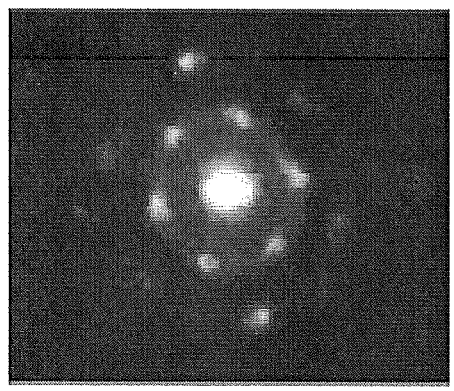
FIGS. 17A and 17B each show a nanobeam electron diffraction pattern of an oxide semiconductor film.
Figure 17B:
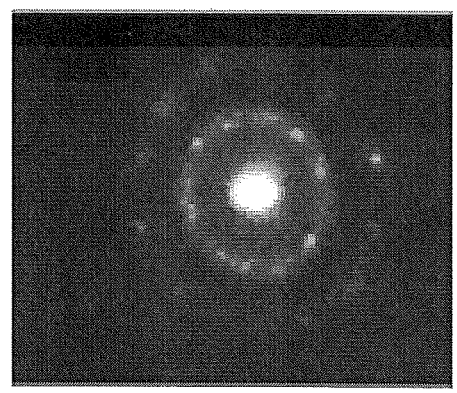

For example, changes in the structure of a substance 9028 can be observed by changing (scanning) the irradiation position of the electrons 9024 that are a nanobeam in the substance 9028, as illustrated in FIG. 18B. At this time, when the substance 9028 is a CAAC-OS film, a diffraction pattern shown in FIG. 17A is observed. When the substance 9028 is an nc-OS film, a diffraction pattern shown in FIG. 17B is observed.

Even when the substance 9028 is a CAAC-OS film, a diffraction pattern similar to that of an nc-OS film or the like is partly observed in some cases. Therefore, whether or not a certain CAAC-OS film is favorable in quality can be expressed by the proportion of a region where a diffraction pattern of a CAAC-OS film is observed in a predetermined area (also referred to as proportion of CAAC). If it is a high quality CAAC-OS film, for example, the proportion of CAAC is higher than or equal to 50%, preferably higher than or equal to 80%, further preferably higher than or equal to 90%, still further preferably higher than or equal to 95%. A proportion of a region where a diffraction pattern different from that of a CAAC-OS film is observed is referred to as the proportion of non-CAAC.

For example, transmission electron diffraction patterns were obtained by scanning a top surface of a sample including a CAAC-OS film obtained just after deposition (represented as "as-sputtered") and a top surface of a sample including a CAAC-OS subjected to heat treatment at 450° C. in an atmosphere containing oxygen. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanobeam with a probe diameter of 1 nm was used. The above measurement was performed on six samples. The proportion of CAAC was calculated using the average value of the six samples.

Figure 19:
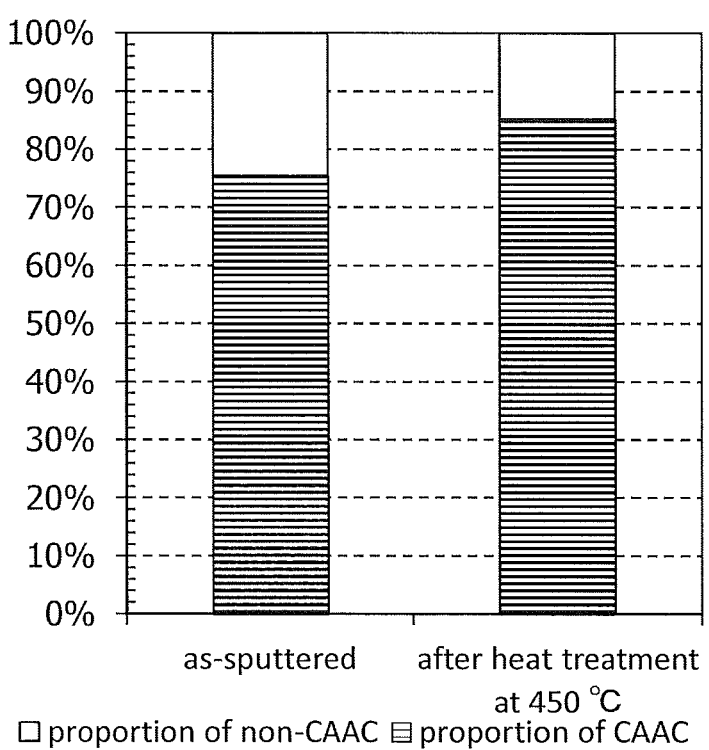
FIG. 19 shows a proportion of CAAC in an oxide semiconductor film.

FIG. 19 shows the proportion of CAAC in each sample. The proportion of CAAC of the CAAC-OS film obtained just after the deposition was 75.7% (the proportion of non-CAAC was 24.3%). The proportion of CAAC of the CAAC-OS film subjected to the heat treatment at 450° C. was 85.3% (the proportion of non-CAAC was 14.7%). These results show that the proportion of CAAC obtained after the heat treatment at 450° C. is higher than that obtained just after the deposition. That is, heat treatment at a high temperature (e.g., higher than or equal to 400° C.) reduces the proportion of non-CAAC (increases the proportion of CAAC). Furthermore, the above results also indicate that even when the temperature of the heat treatment is lower than 500° C., the CAAC-OS film can have a high proportion of CAAC.

Here, most of diffraction patterns different from that of a CAAC-OS film are diffraction patterns similar to that of an nc-OS film. Furthermore, an amorphous oxide semiconductor film was not able to be observed in the measurement region. Therefore, the above results suggest that the region having a structure similar to that of an nc-OS film is rearranged by the heat treatment owing to the influence of the structure of the adjacent region, whereby the region becomes CAAC.

Figure 20A:
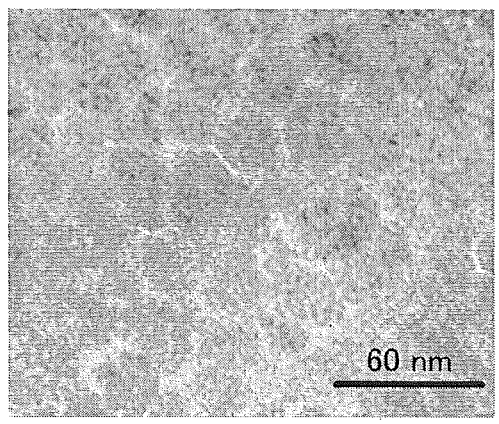
FIGS. 20A and 20B are each a high-resolution plan-view TEM image of an oxide semiconductor.
Figure 20B:
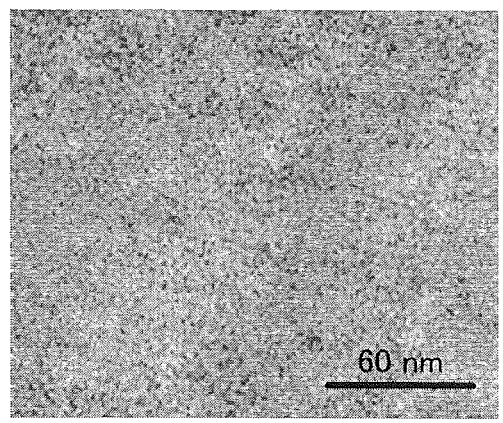

FIG. 20A and FIG. 20B are plan-view HR-TEM images of the CAAC-OS film obtained just after the deposition (as-sputtered) and the CAAC-OS film subjected to the heat treatment at 450° C., respectively. Comparison between FIGS. 20A and 20B shows that the CAAC-OS film subjected to the heat treatment at 450° C. has more uniform film quality. That is, the heat treatment at a high temperature improves the film quality of the CAAC-OS film.

With such a measurement method, the structure of an oxide semiconductor film having a plurality of structures can be analyzed in some cases.

Embodiment 5

The bootstrap circuit of one embodiment of the present invention can be incorporated, as a circuit for generating a voltage or a signal, in a variety of semiconductor devices. For example, the bootstrap circuit can be incorporated in a driver circuit of an active matrix display device or a driver circuit of a memory circuit.

In addition, the bootstrap circuit can be used in electronic devices such as personal computers, and image reproducing devices provided with recording media (devices that read image data of recording media such as digital versatile discs (DVDs) and have displays for displaying images). Other examples of electronic devices that can include the bootstrap circuit of one embodiment of the present invention are mobile phones, game consoles including portable game consoles, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, and multifunction printers. FIGS. 21A to 21F each illustrate specific examples of these electronic devices.

Figure 21A:
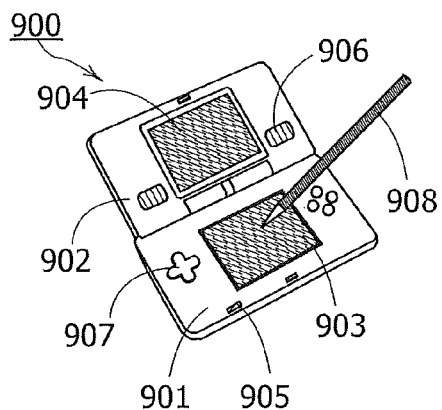
FIGS. 21A to 21F illustrate examples of structures of electronic devices.

FIG. 21A is an external view showing a structure example of a portable game machine. The portable game machine 900 includes a housing 901, a housing 902, a display portion 903, a display portion 904, a microphone 905, a speaker 906, an operation key 907, a stylus 908, and the like.

Figure 21B:
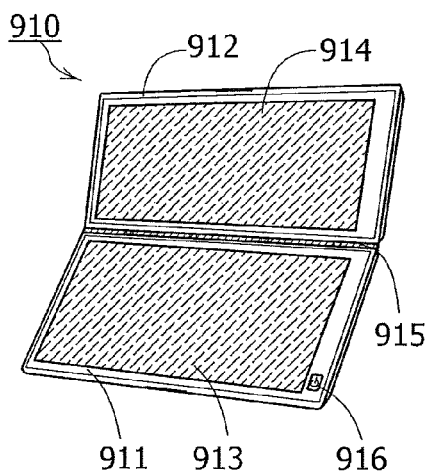

FIG. 21B is an external view showing a structure example of a portable information terminal. The portable information terminal 910 includes a housing 911, a housing 912, a display portion 913, a display portion 914, a joint 915, an operation key 916, and the like. The display portion 913 is provided in the housing 911, and the display portion 914 is provided in the housing 912. The housing 911 and the housing 912 are connected to each other with the joint 915, and an angle between the housing 911 and the housing 912 can be changed with the joint 915. Thus, an image on the display portion 913 may be switched depending on the angle between the housing 911 and the housing 912 at the joint 915. A display device with a touch panel may be used as the display portion 913 and/or the display portion 914.

Figure 21C:
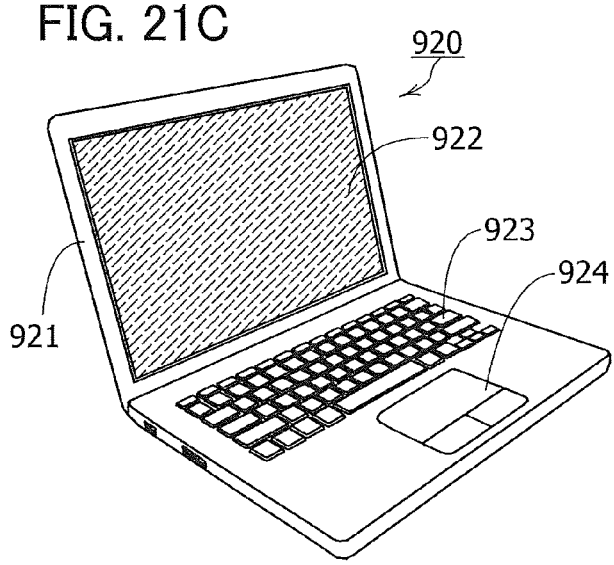

FIG. 21C is an external view showing a structure example of a laptop. The laptop 920 includes a housing 921, a display portion 922, a keyboard 923, a pointing device 924, and the like.

Figure 21D:
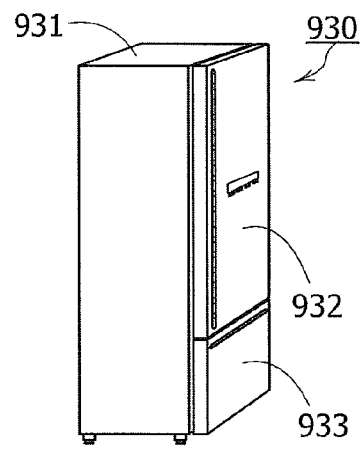

FIG. 21D is an external view showing a structure example of an electric refrigerator-freezer. The electric refrigerator-freezer 930 includes a housing 931, a refrigerator door 932, a freezer door 933, and the like.

Figure 21E:
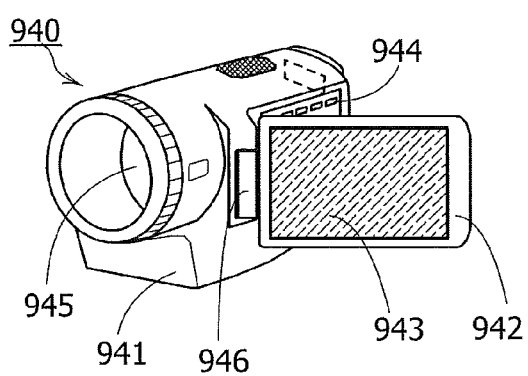

FIG. 21E is an external view illustrating a structure example of a video camera. The video camera 940 includes a housing 941, a housing 942, a display portion 943, operation keys 944, a lens 945, a joint 946, and the like. The operation keys 944 and the lens 945 are provided in the housing 941, and the display portion 943 is provided in the housing 942. The housing 941 and the housing 942 are connected to each other with the joint 946, and an angle between the housing 941 and the housing 942 can be changed with the joint 946. The direction of an image on the display portion 943 may be changed and display and non-display of an image may be switched depending on the angle between the housing 941 and the housing 942.

Figure 21F:
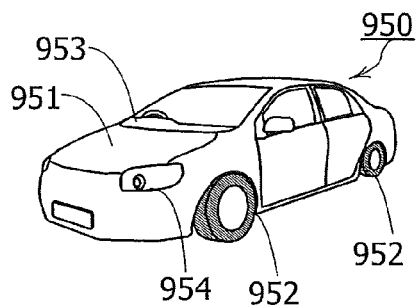

FIG. 21F is an external view showing a structure example of a motor vehicle. The motor vehicle 950 includes a car body 951, wheels 952, a dashboard 953, lights 954, and the like.

The memory device of Embodiment 2 can be used as a cache memory, main memory, or a storage of a variety of processors (e.g., a CPU, a microcontroller, a programmable device such as an FPGA, and an RFID tag). Here, a usage example of an RFID tag will be described, as an example of a processor.

Figure 22A:
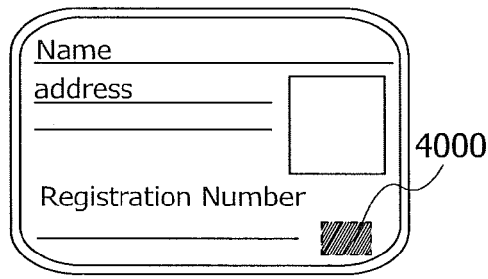
FIGS. 22A to 22F illustrate usage examples of an RFID tag.
Figure 22B:
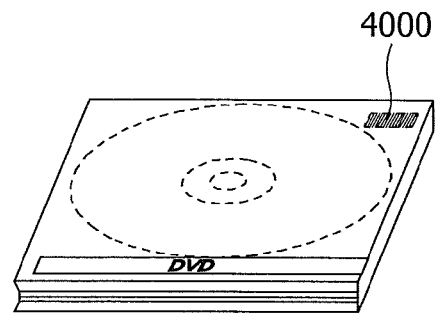
Figure 22C:
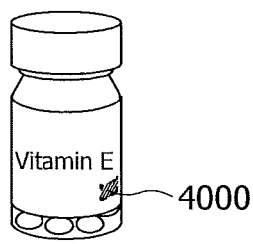
Figure 22D:
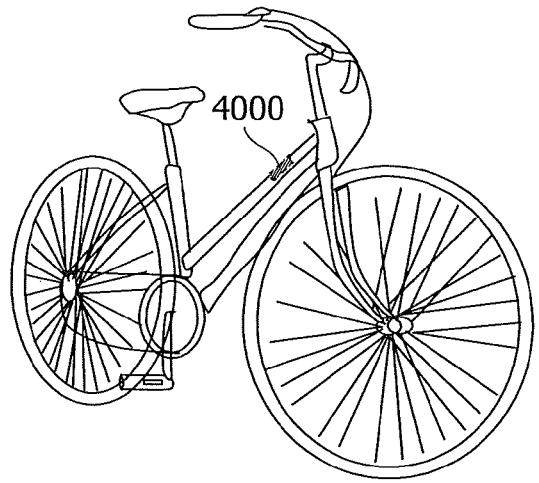
Figure 22E:
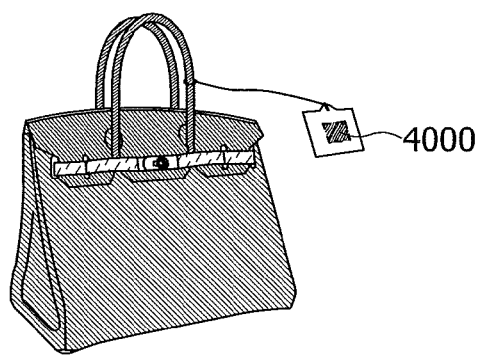
Figure 22F:
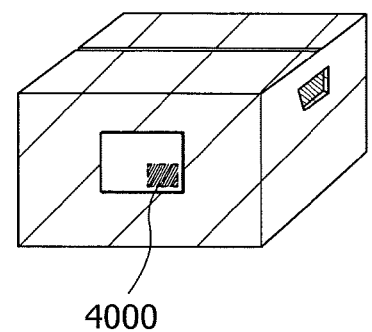

RFID tags can be used in a wide range of fields. For example, they can be provided in objects such as bills, coins, securities, bearer bonds, documents (e.g., driver's licenses or resident's cards, see FIG. 22A), packaging containers (e.g., wrapping paper or bottles, see FIG. 22C), recording media (e.g., DVD software or video tapes, see FIG. 22B), vehicles (e.g., bicycles, see FIG. 22D), personal belongings (e.g., bags or glasses), foods, plants, animals, human bodies, clothing, household goods, medical supplies such as medicine and chemicals, and electronic devices (e.g., liquid crystal display devices, EL display devices, smart phones, cellular phones, clocks, or watches), or tags on objects (see FIGS. 22E and 22F).

An RFID tag 4000 is fixed to a product by being attached to a surface of the product, or embedded in the product. For example, the RFID tag 4000 is fixed to each product by being embedded in paper of a book, or embedded in an organic resin of a package. The RFID tag 4000 is small, thin, and lightweight, so that the design of a product is not impaired even after the RFID tag 4000 is fixed thereto. When the RFID tag 4000 is provided in bills, coins, securities, bearer bonds, documents, or the like, an authentication function can be provided to the objects. The use of the authentication function can prevent forgery. Furthermore, when the RFID tag 4000 is attached to packaging containers, recording media, personal belongings, foods, clothing, household goods, electronic devices, or the like, a system such as an inspection system or an inventory management system can be used efficiently. When the RFID tag 4000 is attached to vehicles, the level of security can be raised.

This application is based on Japanese Patent Application serial no. 2013-207452 filed with Japan Patent Office on Oct. 2, 2013, the entire contents of which are hereby incorporated by reference.

What is claimed is:

1. A bootstrap circuit comprising:
   a first input terminal and a second input terminal to which a first signal and a second signal are input, respectively;
   an output terminal;
   a first transistor;
   a capacitor; and
   a first circuit,
   wherein one terminal of the capacitor is connected to the second input terminal, and the other terminal of the capacitor is connected to the output terminal,
   wherein one of a source and a drain of the first transistor is directly connected to the other terminal of the capacitor,
   wherein the other of the source and the drain of the first transistor is connected to the first input terminal,
   wherein the first circuit comprises a second transistor,
   wherein one of a source and a drain of the second transistor is directly connected to the other terminal of the capacitor,
   wherein the first transistor is diode-connected so as to allow a forward current to flow in the first transistor when the first signal is at a high level, and
   wherein the first circuit has a function of applying a voltage directly to the output terminal when the first signal is at a low level, thereby maintaining a voltage of the output terminal.

2. A semiconductor device comprising:
   a third transistor comprising an oxide semiconductor layer comprising a channel formation region; and
   the bootstrap circuit according to claim 1,
   wherein a signal output from the output terminal of the bootstrap circuit is input to a gate of the third transistor.

3. An electronic device comprising:
   a memory device comprising:
      a memory cell array; and
      a driver circuit comprising the bootstrap circuit according to claim 1.

4. A bootstrap circuit comprising:
   a first input terminal and a second input terminal to which a first signal and a second signal are input, respectively;
   an output terminal;
   a first transistor and a second transistor;
   a capacitor; and
   a first inverter,
   wherein one terminal of the capacitor is connected to the second input terminal and the other terminal of the capacitor is connected to the output terminal,
   wherein one of a source and a drain of the first transistor is connected to the output terminal,
   wherein the other of the source and the drain of the first transistor is connected to the first input terminal,
   wherein a gate of the first transistor is connected to the other of the source and the drain of the first transistor,
   wherein an input node of the first inverter is connected to the first input terminal,
   wherein one of a source and a drain of the second transistor is connected to the output terminal, and
   wherein an output node of the first inverter is connected to a gate of the second transistor.

5. A semiconductor device comprising:
   a third transistor comprising an oxide semiconductor layer comprising a channel formation region; and
   the bootstrap circuit according to claim 4,
   wherein a signal output from the output terminal of the bootstrap circuit is input to a gate of the third transistor.

6. An electronic device comprising:
   a memory device comprising:
      a memory cell array; and
      a driver circuit comprising the bootstrap circuit according to claim 4.

7. A bootstrap circuit comprising:
   a first input terminal, a second input terminal, and a third input terminal to which a first signal, a second signal, and a third signal are input, respectively;
   an output terminal;
   a first transistor and a second transistor;
   a first capacitor and a second capacitor;
   a first inverter; and
   a first circuit and a second circuit, wherein the third input terminal is connected to an input node of the first inverter, wherein the first transistor connects an output node of the first inverter to a gate of the second transistor, and is diode-connected so as to allow a forward current to flow from the output node of the first inverter to the gate of the second transistor, wherein the second transistor connects the first input terminal to the output terminal, wherein one terminal of the first capacitor is connected to the first input terminal and the other terminal of the first capacitor is connected to the gate of the second transistor, wherein one terminal of the second capacitor is connected to the second input terminal and the other terminal of the second capacitor is connected to the output terminal, wherein the first circuit has a function of maintaining a voltage of the output terminal, and wherein the second circuit has a function of maintaining a gate voltage of the second transistor.

8. A semiconductor device comprising:

a third transistor comprising an oxide semiconductor layer comprising a channel formation region; and the bootstrap circuit according to claim 7, wherein a signal output from the output terminal of the bootstrap circuit is input to a gate of the third transistor.

9. An electronic device comprising:

a memory cell array; and a driver circuit comprising the semiconductor device according to claim 8.

10. A bootstrap circuit comprising:

a first input terminal, a second input terminal, and a third input terminal to which a first signal, a second signal, and a third signal are input, respectively;

an output terminal;

a first transistor, a second transistor, a third transistor, and a fourth transistor;

a first capacitor and a second capacitor; and a first inverter, a second inverter, and a third inverter, wherein the third input terminal is connected to an input node of the first inverter, wherein the first transistor connects an output node of the first inverter to a gate of the second transistor, and is diode-connected so as to allow a forward current to flow from the output node of the first inverter to the gate of the second transistor, wherein one terminal of the first capacitor is connected to the first input terminal and the other terminal of the first capacitor is connected to the gate of the second transistor, wherein one terminal of the second capacitor is connected to the second input terminal and the other terminal of the second capacitor is connected to the output terminal, wherein the second transistor connects the first input terminal to the output terminal, and is diode-connected so as to allow a forward current to flow from the first input terminal to the output terminal, wherein the third transistor connects the output terminal to a first wiring, and a gate of the third transistor is connected to an output node of the second inverter, wherein an input node of the second inverter is connected the first input terminal, wherein the fourth transistor connects the gate of the second transistor to a second wiring, and a gate of the fourth transistor is connected to an output node of the third inverter, wherein an input node of the third inverter is connected to the output node of the first inverter, and wherein a first voltage is input to the first wiring and the second wiring.

11. A semiconductor device comprising:

a fifth transistor comprising an oxide semiconductor layer comprising a channel formation region; and the bootstrap circuit according to claim 10, wherein a signal output from the output terminal of the bootstrap circuit is input to a gate of the fifth transistor.

12. An electronic device comprising:

a memory device comprising:
   a memory cell array; and
   a driver circuit comprising the bootstrap circuit according to claim 10.

* * * * *